(12) United States Patent
Madigan et al.

(10) Patent No.: US 12,059,910 B2
(45) Date of Patent: Aug. 13, 2024

(54) TECHNIQUES FOR MANUFACTURING THIN FILMS WITH IMPROVED HOMOGENEITY AND PRINT SPEED

(71) Applicant: Kateeva, Inc., Newark, CA (US)

(72) Inventors: Conor F. Madigan, San Francisco, CA (US); Christopher R. Hauf, Belmont, CA (US)

(73) Assignee: Kateeva, Inc., Newark, CA (US)

( * ) Notice: Subject to any disclaimer, the term of this patent is extended or adjusted under 35 U.S.C. 154(b) by 262 days.

(21) Appl. No.: 17/454,167

(22) Filed: Nov. 9, 2021

(65) Prior Publication Data
US 2022/0063293 A1  Mar. 3, 2022

Related U.S. Application Data

(63) Continuation of application No. 15/368,290, filed on Dec. 2, 2016, now Pat. No. 11,203,207.
(Continued)

(51) Int. Cl.
*B41J 3/407* (2006.01)
*B41J 2/21* (2006.01)
(Continued)

(52) U.S. Cl.
CPC ............ *B41J 3/407* (2013.01); *B41J 2/2135* (2013.01); *H01L 31/048* (2013.01);
(Continued)

(58) Field of Classification Search
CPC ....... B41J 3/407; B41J 2/2135; H10K 71/135; H10K 71/13; H10K 71/00;
(Continued)

(56) References Cited

U.S. PATENT DOCUMENTS 6,099,108 A * 8/2000 Weber .................. B41J 2/1404
347/43
6,145,981 A  11/2000 Akahira et al.
(Continued)

FOREIGN PATENT DOCUMENTS

CN  1364693 A  8/2002
CN  1532052 A  9/2004
(Continued)

OTHER PUBLICATIONS

European Extended Search Report issued Jul. 5, 2019 for EP Application No. 1687368.7.
(Continued)

*Primary Examiner* — Brian K Talbot
(74) *Attorney, Agent, or Firm* — Hauptman Ham, LLP

(57) ABSTRACT

Improved manufacturing using a printer that deposits a liquid to fabricate a layer having specified thickness includes automated adjustment or print parameters based on ink or substrate characteristics which have been specifically measured or estimated. In one embodiment, ink spreading characteristics are used to select droplet size used to produce a particular layer, and/or to select a specific baseline volume/area or droplet density that is then scaled and/or adjusted to provide for layer homogeneity. In a second embodiment, expected per-droplet particulars are used to interleave droplets in order to carefully control melding of deposited droplets, and so assist with layer homogeneity. The liquid layer is then cured or baked to provide for a permanent structure.

20 Claims, 14 Drawing Sheets

Related U.S. Application Data

(60) Provisional application No. 62/264,076, filed on Dec. 7, 2015.

(51) Int. Cl.
*H01L 31/048* (2014.01)
*H10K 50/844* (2023.01)
*H10K 71/00* (2023.01)
*H10K 71/13* (2023.01)
*H10K 50/11* (2023.01)
*H10K 50/15* (2023.01)
*H10K 50/16* (2023.01)
*H10K 50/17* (2023.01)

(52) U.S. Cl.
CPC ........... *H10K 50/844* (2023.02); *H10K 71/00* (2023.02); *H10K 71/13* (2023.02); *H10K 71/135* (2023.02); *H10K 50/11* (2023.02); *H10K 50/15* (2023.02); *H10K 50/16* (2023.02); *H10K 50/17* (2023.02); *H10K 50/171* (2023.02)

(58) Field of Classification Search
CPC .. H10K 50/84417; H10K 50/16; H10K 50/11; H10K 50/171; H10K 50/15; H10K 31/048
USPC ......................................................... 427/98.4
See application file for complete search history.

(56) References Cited

U.S. PATENT DOCUMENTS

| | | | |
|---|---|---|---|
| 6,702,425 | B1 | 3/2004 | Yip et al. |
| 7,582,333 | B2 | 9/2009 | Hirai et al. |
| 8,248,656 | B2 * | 8/2012 | Lin ............... H01L 21/6715 358/1.14 |
| 8,342,636 | B2 | 1/2013 | Nakano et al. |
| 9,700,908 | B2 | 7/2017 | Baker |
| 2004/0234678 | A1 | 11/2004 | Hirai et al. |
| 2006/0082604 | A1 | 4/2006 | Florence et al. |
| 2006/0125363 | A1 | 6/2006 | Tahira et al. |
| 2007/0182770 | A1 | 8/2007 | Yoshida et al. |
| 2007/0225404 | A1 * | 9/2007 | Umebayashi .......... B41M 7/009 524/544 |
| 2008/0211849 | A1 * | 9/2008 | Pierik ................ B41J 2/04586 347/14 |
| 2015/0099059 | A1 * | 4/2015 | Harjee ................ B41J 2/04593 427/8 |
| 2015/0171368 | A1 | 6/2015 | Vronsky et al. |
| 2015/0298153 | A1 * | 10/2015 | Baker .................... H10K 71/00 118/712 |
| 2015/0373305 | A1 | 12/2015 | Hauf et al. |
| 2021/0220857 | A1 * | 7/2021 | Baker ................. B41J 2/04581 |
| 2022/0274131 | A1 * | 9/2022 | Pervan .................. B05D 3/065 |

FOREIGN PATENT DOCUMENTS

| | | |
|---|---|---|
| CN | 1589412 A | 3/2005 |
| CN | 101680091 A | 3/2010 |
| CN | 103241025 A | 8/2013 |
| CN | 105051932 A | 11/2015 |
| EP | 0816103 A2 | 1/1998 |
| JP | 2005296904 A | 10/2005 |
| JP | 2010075813 A | 4/2010 |
| JP | 2012218233 A | 11/2012 |
| KR | 20080102829 A | 11/2008 |
| TW | 200410591 A | 6/2004 |
| WO | 2014176365 A2 | 10/2014 |

OTHER PUBLICATIONS

Final Office action issued on Feb. 12, 2019, to U.S. Appl. No. 15/368,290.
First Office Action issued Mar. 23, 2021 to CN Patent Application No. 202010250019.7.
International Search Report and Written Opinion mailed on Feb. 8, 2017, for PCT Application No. PCT/US2016/064788.
Non-Final Office Action issued on Aug. 6, 2018 to U.S. Appl. No. 15/368,290.
Notice of Allowance issued Jul. 21, 2021 to U.S. Appl. No. 15/368,290.
Notice of Reason of Refusal issued Dec. 7, 2020 to JP Application 2018-529134.
Office Action issued Jun. 26, 2019 for CN Patent Application No. 201680081246.3.
Official Action issued Dec. 30, 2020 to TW Patent Application No. 105140236.
Official Letter issued Sep. 4, 2020 to TW Patent Application No. 105140236.
Office Action issued Nov. 9, 2021 for CN Patent Application No. 201680081246.3.
JP Non-Final Office Action issued Sep. 5, 2022 for JP Patent Application No. 2021-161948.

* cited by examiner

TECHNIQUES FOR MANUFACTURING THIN FILMS WITH IMPROVED HOMOGENEITY AND PRINT SPEED

CROSS-REFERENCE TO RELATED APPLICATIONS

This application is a continuation of U.S. patent application Ser. No. 15/368,290, filed on Dec. 2, 2016, which application claims priority to U.S. Provisional Application 62/264,076, filed Dec. 7, 2015 for "Techniques for Manufacturing Thin Films with Improved Homogeneity and Print Speed," and incorporates by reference the following documents: U.S. Pat. No. 9,352,561 (U.S. Ser. No. 14/340,403) issued on May 31, 2016 for "Techniques for Print Ink Droplet Measurement and Control to Deposit Liquids within Precise Tolerances;" U.S. Pat. No. 9,010,899, issued on Apr. 21, 2015 for "Techniques for Print Ink Volume Control to Deposit Liquids Within Precise Tolerances;" U.S. Pat. No. 8,995,022, issued on Mar. 31, 2015 for "Ink-Based Layer Fabrication Using Halftoning To Control Thickness;" US Patent Publication No. 2015/0373305 (U.S. Ser. No. 14/840,343), filed on Aug. 31, 2015, for "Fast Measurement of Droplet Parameters in Industrial Printing System" (U.S. Ser. No. 14/840,343, filed on Aug. 31, 2015); and US Patent Publication No. 2015/0298153 (U.S. Ser. No. 14/788,609), filed on Jun. 30, 2015, for "Techniques for Arrayed Printing of a Permanent Layer with Improved Speed and Accuracy."

BACKGROUND

Printers are used in a wide variety of industrial processes for fabrication. In one application, printers can be used to jet a liquid onto a substrate, where the liquid is then cured, dried or otherwise processed to form a permanent layer of an electronic device. This technique is especially useful for the deposition of materials that cannot be easily deposited using other techniques, for example, organic materials (e.g., such as plastics). One example application involves the fabrication of display panels (such a televisions or other display screens), solar panels and light emitting devices. For example, printers can be used to deposit organic LED materials that help generate light under the influence of electrical stimuli, as well as organic encapsulation layers that help protect sensitive internal layers from exposure to oxygen, moisture, or other contaminants. In a conventional process used to fabricate large panel electronic devices, these printers can be "room-sized" and used to print on very large substrates within very precise parameters, as part of an assembly-line style process; large panel devices can be formed out of these substrates (e.g., large TVs or solar panels) or, alternatively, many small devices can be formed on these substrates and then separated from each other. Naturally, these applications are illustrative only, and printers can be used in many fabrication processes to print many different materials (organic or otherwise), for many types of devices other than electronic devices.

As technologies improve, manufacturing specifications typically call for deposited layers to be thinner and less variable, all while providing the same or better performance characteristics. However, as dimensions are reduced, it also becomes harder to produce very thin layers using the technologies just described; for example, while slight unevenness (e.g., micron scale roughness) can typically be tolerated in the surface of a thick layer (e.g., 30 microns or more for the applications mentioned above), the same variation can result in layer failure or other unacceptability for thinner layers (e.g., layers which are less than about 10 microns thick for the applications mentioned above). Unexpected thinness (i.e., thickness variation) over a layer's geometry can potentially give rise to moisture or oxygen corruption, can result in the loss of an adequate seal at a layer periphery, or can otherwise create noticeable performance defects.

To cite one example of these difficulties, it is expected for organic light emitting diode (OLED) displays that manufacturing specifications will call for layers that are less than ten microns thick, with regulated uniformity in layer thickness and very precise boundary control. Such precision is difficult to achieve, particularly when it is considered that conventional print heads might deposit 20-30 micron diameter droplets at pitches of twenty-to-thirty microns or more (e.g., if printed droplets do not spread properly, they can produce a layer with voids/gaps, or that locally is either too thick or too thin). In this regard, droplet spreading and melding of adjacent droplets can be a complex and imprecise process, particularly outside a laboratory setting; factors such as droplet viscosity, surface tension, atmospheric temperature, substrate materials, surface chemistry and geometry, static electricity, substrate temperature, nozzle error, particulate contamination and other factors can make it difficult to provide for a manufacturing-grade, repeatable process. At the opposite extreme, it is typically desired to have a printing process that is as fast as possible, for example, printing a room-sized substrate in less than about sixty-to-one-hundred-and-twenty seconds, and the commercial viability of a process can be threatened if manufacturing takes too long. That is, for example, if deposited liquid requires an excessive settling time to form an even liquid coat, or if the deposited liquid spreads insufficiently or irregularly, the production process can be too expensive, or resultant layer can have defects such as undesired variations, irregularities or gaps. To reiterate the point made earlier, it is difficult to print precision layers of liquid in a manufacturing process, where liquid thickness translates to ultimate material thickness, for very thin layers.

What is needed is a set of techniques to facilitate repeatable manufacturing processes that use a printer to deposit a liquid, where the liquid is to be processed (cured, dried, or otherwise rendered into a permanent element of a product) to form a layer having a desired thickness. Further still, which is needed is a set of techniques for fabricating layers with greater control, and such that deposited layers have greater reliability and consistency, particularly for thin, organic layers. The present invention addresses these needs and provides other, related advantages.

Figure 1:
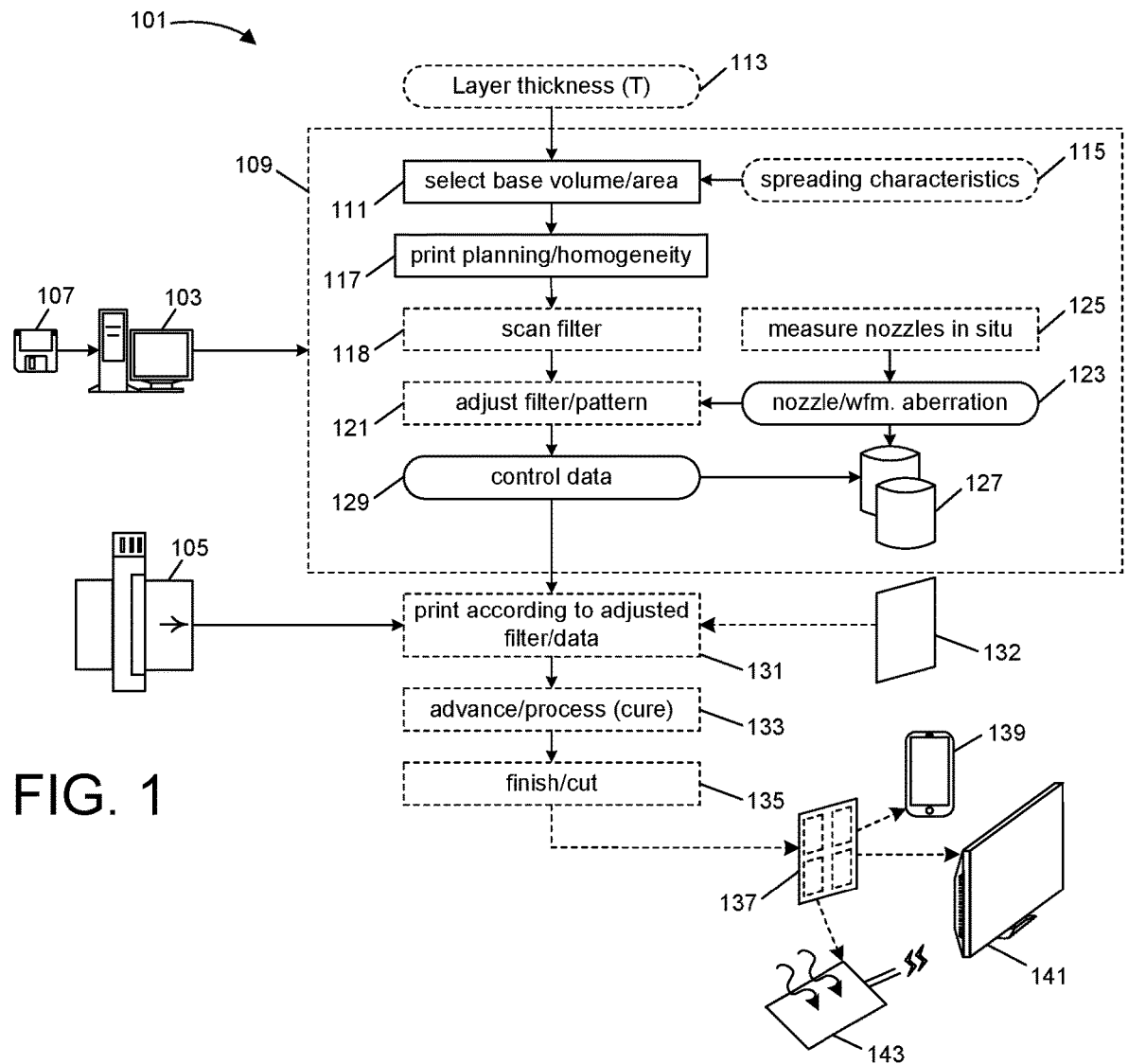
FIG. 1 is an illustrative diagram showing some techniques for manufacturing thin films with improved homogeneity and print speed.

The subject matter defined by the enumerated claims may be better understood by referring to the following detailed description, which should be read in conjunction with the accompanying drawings. This description of one or more particular embodiments, set out below to enable one to build and use various implementations of the technology set forth by the claims, is not intended to limit the enumerated claims, but to exemplify their application to certain methods, systems, apparatuses and devices. While specific examples are presented, particularly in the context of fabrication of solar panels, displays such as organic light-emitting diode ("OLED") display devices, and other light emitting devices, and more particularly to the fabrication of very specific thin film layers, the principles described herein may also be applied to other methods, systems, apparatuses and devices as well.

DETAILED DESCRIPTION

This disclosure provides techniques for improved manufacturing using a printer that deposits a liquid to fabricate a layer having specified thickness and other desired layer characteristics.

A first set of principles involves a manufacturing method where ink and/or substrate characteristics are specifically measured (or estimated or dead reckoned) and are then used to select or adjust droplet deposition environment via print head selection or control, or other control over specific ink droplet parameters. In this regard, given expected ink spreading in a deposition process (e.g., dependent on substrate, process, ink or other characteristics), the process can be specially adjusted or selected so as to produce an acceptable deposition within specified tolerances for layer thickness and deposition time. In one application, a linkage between volume of ink per unit area (volume/area), droplet deposition pattern and/or droplet size and layer thickness is set or specially adjusted in dependence on expected spreading characteristics of the deposition liquid (i.e., the "ink") for a given piece of manufacturing equipment, deposition environment and print process. For example, U.S. Pat. No. 8,995,022 for "Ink Based Layer Fabrication Using Halftoning To Control Thickness" relates to a process where, in order to build a layer to have a desired thickness, thickness values for a layer are converted into an "ink fill" density (e.g., amount of ink per unit area of the substrate); the ink as printed has a limited spreading characteristic and once the relationship between ink volume/area and resultant layer thickness is understood, then a scaled volume/area can be used to "build" a layer having desired thickness. Among other things, the present disclosure provides specific techniques that can be used to select values suitable to that relationship. To relay an example, if a baseline amount of ink per unit area produces blanket coverage of the substrate at one-micron thickness, and a three micron thick layer was desired, then the baseline amount of ink per unit area might be tripled to produce the desired three micron thick layer. Pursuant to the first set of techniques discussed herein, if droplet spreading is understood or quantified (e.g., through measurement, estimation or dead reckoning), then a baseline volume per unit area can be selected that will produce blanket coverage and an understanding developed as to resultant thickness that will be produced using that baseline amount of ink per unit area; the present disclosure provides techniques for selecting deposition parameters that can be used to develop this understanding, with the scaling techniques just referenced then relied on in order to produce the appropriate layer thickness within specified tolerances, with reduced deposition time.

Note that a number of different parameters can be adjusted to achieve these ends. For example, if a given ink and deposition process produces thick droplets of limited spreading (i.e., that is, the ink droplets cannot produce a layer of desired thickness because the droplets are too thick and the resultant layer will be too thick), then a different print head can be selected or nozzle electronic control adjusted so as to produce smaller droplets. In one design, instead of (or in addition to) changing the print head or nozzle drive signals, a nozzle print grid (e.g., droplet pitch) can be varied, for example, changing the firing frequency of the nozzles to vary the in-scan nozzle pitch, or rotating the print head to vary the effective cross-scan nozzle pitch, staggering multiple printheads relative to one another, or any combination of these things. In yet another design, a print head is used which can feature multiple discrete droplet sizes (e.g., 1× volume, 2× volume, 3× volume, 4× volume, etc.), and droplet size selection based on measured, estimated or dead reckoned spreading characteristics. Note that while one example features drop sizes that are integer multiples of one another (or close to such values in terms of volume), other examples feature much more subtle differences, with tuned or "customized" waveforms used to exactly customize deposition volume. To the extent that droplet volume can be varied between multiple sizes, in one implementation, the largest droplet size of a set of candidate, acceptable droplet sizes that can produce the desired layer is selected for use. For example, a method predicated on these specific principles can, based on expected spreading, determine whether each available droplet size can (at the volume per unit area needed to obtain blanket coverage) produce the desired layer (i.e., the layer is not too thick following cure). The largest droplet volume (and associated process characteristics) satisfying this test is then selected, possibly in combination with other, smaller droplet sizes. If desired, an optional "buffer" can also be injected in to the process so as to allow a margin for error associated with process variation; for example, if a given droplet size produces blanket coverage at "exactly" the desired thickness, then such a droplet size can be rejected, with selection of the largest droplet instead predicated on ability to produce the desired layer thickness minus some artificially injected buffer, e.g., a desired layer thickness minus ten percent.

Many examples and variations will occur to those of ordinary skill in the art. In the description below, various systems, devices, apparatuses, processes and combinations will become apparent which effectuate these principles.

A second set of principles involves understanding nozzle error (e.g., volume aberration, error in nozzle position or "nozzle bow") or error in droplet landing location (e.g., a function of nozzle bow and/or droplet trajectory and/or propensity for "wicking") and correcting nozzle selection and/or timing and/or droplet size in order to deposit ink such that droplets have appropriate melding characteristics. Note that any of these techniques can be optionally mixed and matched with the first set of techniques discussed above (and other techniques discussed below). In this regard, the surface tension characteristics of droplets can be such that the droplets exhibit wicking characteristics that distort effective droplet positioning, essentially drawing fellow droplets out of position. Such a problem can be greatly exacerbated by the factors and/or errors mentioned above. Techniques are presented herein for mitigating this tendency through the use of a filter that "interleaves" droplets across multiple scan passes, such that the melding of adjacent droplets is carefully controlled (e.g., by adding "linking" droplets last, or otherwise in a planned manner). Note that in one embodiment, nozzle and/or droplet positional error is deliberately factored into the print planning process, such that measured, expected variation in droplet size and/or landing position is relied upon in planning the interleaving just discussed. For example, in a specifically contemplated implementation, droplets can be repeatedly measured, per nozzle (or per waveform available for each nozzle, for every nozzle), to develop a statistical population of measurements for each nozzle (or per "nozzle-waveform combination"). This helps reduce measurement error according to the well-known $n^{1/2}$ relationship (i.e., relative to the number n of measurements) and helps define accurate expected values and deviation/ variance measures for droplet volume and/or landing position per-nozzle and/or per nozzle-waveform combination. The statistical parameters can then then factored into the interleaving and/or printing process to produce a homogeneous droplet density using the interleaving, multi-scan process just discussed). As noted above, the other techniques discussed herein can also be optionally mixed and matched with these techniques, even if not described specifically called out in association with each detail embodiment. For example, different droplet sizes can be optionally combined with interleaving, e.g., using larger volume droplets in one pass and "interleaved" smaller volume droplets in another pass); to cite another example, these techniques can be optionally combined with in situ, per-nozzle dynamically measured data, as disclosed by U.S. Pat. Nos. 9,010,899 and 9,352,561, and the other patents and publications which are incorporated by reference.

With the general principles thus introduced, this disclosure will now turn toward describing a number of detailed implementations.

Note first that several terms used herein should be introduced. First, references to "ink" should be understood to refer to a liquid that has been or will be printed onto a substrate and that is then processed (e.g., cured, dried, polymerized, hardened or otherwise converted into a permanent part of a product), to form a material having thickness, where inherent liquid coloring or specific shading is generally not directly important; this differs for example from graphics applications where ink has a specific color or shade property that is to be transferred to a medium to directly impart an image pattern, i.e., where such "ink" once applied is typically without substantial (or critical) thickness, and is deposited to create an immediate visual effect. In applications discussed herein, the deposited liquid can ultimately be used for some graphics or display application (e.g., a deposited liquid can according to the principles herein be used for form a light generating layer of a red, green or blue pixel, or otherwise used to produce light, color or other optical effect when it is ultimately electrically activated), but the point is that the material is being deposited for some type of mechanical, structural, optical or electrical property that will interact with other layers. Second, references to "halftone" or "halftoning" used herein should similarly be understood not to refer to the conventional graphics' usage of these terms, but rather to suggest that ink can be printed to provide for a specific volume per unit area to impart thickness, flow, spreading, melding or other mechanical (or materials) properties of the deposited layer; that is to say, "halftoning" in graphics applications conventionally refers to the use of droplets of one or more colors in relative amounts in order to directly convey a visual characteristic, whereas herein, a "halftone" as used herein simply refers to a droplet pattern that will create a liquid layer of specified thickness following layer processing. "Density" when used relative to ink refers to such volume per-unit area and, for example, can be adjusted by (1) varying individual droplet sizes/volumes, (2) changing print grid pitch or otherwise adjusting density of droplets per unit area of the substrate (e.g., more droplets are printed into a given unit area), or (3) other techniques. A "print grid" refers to an imaginary mesh representing all possible "dots" or specific locations where an ink droplet could in theory be deposited given electromechanical properties used for printing in a given print scan; typically separation in this grid along a first axis is a function of effective nozzle pitch (nozzle separation) in the direction of the first axis, while separation along a second axis is a function of digital electronics (e.g., representing the maximum frequency at which a nozzle can be fired in a given print scan). Note that some techniques discussed herein can speak in terms of varying the print grid spacing, for example, adjusting the frequency of a digital signal used to time (i.e., trigger) nozzle firing of droplets, changing the mechanical scanning speed, rotating the print head (to effectively change nozzle pitch according to a sine function of rotation angle), advancing the printhead fractionally/incrementally along an in-scan/cross-scan or other axis (between or during scans), and so forth—these various mechanisms are non-limiting examples. "Circuitry" can refer to analog or digital electronic elements (e.g., dedicated logic gates), either arranged as special purpose circuitry that necessarily performs a certain function when electrically motivated, or as general purpose circuitry (e.g., a processor, FPGA or other configurable circuit) that is controlled or otherwise configured by instructions (software) so as to adapt that circuitry to perform a specific function and cause that circuitry to operate as though it was special purpose circuitry. In the case of software or other instructional logic, the instructions are typically written or designed in a manner that has certain structure (architectural features) such that, when those instructions are ultimately executed, they cause the one or more general purpose circuits or hardware devices to necessarily perform certain described tasks. "Logic" can refer to software logic (i.e., instructional logic) or hardware logic (e.g., a digital chip or board design) or a combination of these things. "Non-transitory machine-readable media" means any tangible (i.e., physical) storage medium, irrespective of how data on that medium is stored, including without limitation, random access memory, hard disk memory, optical memory, a floppy disk or CD, server storage, volatile memory, memory card and/or other tangible mechanisms where instructions may subsequently be retrieved by a machine. The machine-readable media can be in standalone form (e.g., a program disk, solid state memory card, whether bootable or executable or otherwise, or in other memory) or embodied as part of a larger mechanism, for example, a laptop computer, portable or mobile device, server, data center, "blade" device, subsystem, electronics "card," storage device, network, or other set of one or more other forms of devices. The instructions can be implemented in different formats, for example, as metadata that when called is effective to invoke a certain action, as Java code or scripting, as code written in a specific programming language (e.g., as C++ code), as a processor-specific instruction set, or in some other form; the instructions can also be executed by the same processor or common circuits, or by different processors or circuits, depending on embodiment. For example, "instructions stored on non-transitory machine-readable media" typically refers to software stored on disk or in other physical memory or storage, where the software is structured such that when it is later (ultimately) installed or executed by an operator or end user, it configures a machine (e.g., one or more processors) so that it operates in a prescribed manner. In one implementation, instructions on non-transitory machine-readable media can be executed by a single computer and, in other cases as stated, it can be stored and/or executed on a distributed basis, e.g., using one or more servers, web clients, or application-specific devices, whether collocated or remote from each other. Each function mentioned in the disclosure or FIGS. can be implemented as part of a combined program or as a standalone software module (i.e., an invocable or callable program or subroutine), either stored together on a single media expression (e.g., single floppy disk) or on multiple, separate storage devices, or in the form of dedicated circuitry or circuitry combined with such software. "Blanket" coverage or "complete" coverage refers to the notion that a deposited liquid (after any allowed spreading or settling time) at least locally-speaking, e.g., per unit area of the substrate, has no voids or gaps uncovered by liquid. Note that in most processes discussed herein, droplets are deposited at discrete locations on a substrate, and those droplets spread and then meld together according to some decay function so as to spread and wet the substrate; "blanket" coverage typically assumes that the droplets have required some non-zero spreading time following printing in order to meld in this manner. "Module" as used herein refers to a structure dedicated to a specific function; for example, a "first module" to perform a first specific function and a "second module" to perform a second specific function, when used in the context of instructions (e.g., computer code) refers to mutually-exclusive code sets. When used in the context of mechanical or electromechanical structures (e.g., a "printer module," it refers to a dedicated set of components which might also include software, depending on embodiment); for example, a "print module" and a "cure module" would refer to dedicated, mutually exclusive structural elements for performing these functions. In all cases, the term "module" is used to refer to a specific structure for performing a function or operation that would be understood by one of ordinary skill in the art to which the subject matter pertains as a conventional structure used in the specific art (e.g., a software module or hardware module), and not as a generic placeholder or "means" for "any structure whatsoever" (e.g., "a team of oxen") for performing a recited function. "Processing," when used to refer to a post-deposition step applied to liquid ink on a substrate, refers to step applied to the liquid ink to make it a permanent part of a device, for example, by curing, hardening, drying, polymerizing, or otherwise converting the liquid to a form (flexible or otherwise) suitable as a permanent structure of the device.

FIG. 1 is an illustrative diagram showing some techniques for manufacturing thin films with improved homogeneity and print speed. More specifically, FIG. 101 provides a sequence of functions generally identified by reference numeral 101. These techniques include the use of at least one processor (represented by computer icon 103) to plan and/or control printing by an industrial fabrication printer 105. The at least one processor 103 is operated under the auspices of software, represented by a floppy-disk icon 107. When they are executed, the software (i.e., instructions) cause the at least one processor to perform specific functions (109) that will plan printing so as to produce a desired layer thickness. As discussed earlier, this layer can be a thin-film layer of a specific material that will be used as part of a solar panel, a display (e.g., an electronic flat panel device) or another form of light emitting device; for example, these processes can be used to plan printing, and then effectuate printing on a substrate (130) where that substrate will ultimately form a mobile device display (139), another type of display (e.g., TV screen, 141), or solar panel (143), or an array of such devices or other electronic devices (represented by arrayed-substrate 137).

As denoted by a dashed-line starting block 113, the fabrication apparatus and/or its control system receive a layer thickness for a layer to be fabricated upon a substrate. The layer can be deposited locally only (e.g., specifically within the confines of a pixel well, to form a light-generating element layer or other type of layer in an electronic device stack), or it can be deposited over a large area of the substrate (e.g., as a smoothing, barrier, electrode, insulator or encapsulation layer that spans many electronic structural components, or that provides for other effects, e.g., optical effects created using a high refractive index material or a specific combination of materials). Irrespective of application, in this embodiment, it is assumed that the layer is to have a flat top surface and a specifically desired (even) thickness in the specified target region, and the instructions cause the control system to select a baseline volume per unit area of ink, as is represented by numeral 111; note that as mentioned earlier, in other examples, this thickness can be varied from target region-to-target region if desired (e.g., to compensate for variation in underlying surface geometry), or adjusted in a manner consistent with an edge taper or other specific profile. The control system optionally utilizes (measured, dead-reckoned or estimated) spreading characteristics (115) for the ink that will be used for printing in order to select this baseline volume per unit area. Note that for the applications discussed herein, it is generally desired to have a defect-free, uniform film within the intended deposition region, that is, without voids/gaps and with minimal unintended thickness variation. To this effect, the baseline volume per unit area typically is achieved via a density of droplets that, once deposited (i.e., printed), will spread so as to meld with one another and result in blanket coverage of the intended target region of the substrate. In the event that the specific layer is to be an element of an electronic layer stack (e.g., a functional layer in a light generating element), the target region is the intended geometry of the layer (e.g., with layer height and width established in advance); in the event that the specific layer is to be a continuous layer that spans many electronic components (e.g., an encapsulation, barrier, smoothing or similar layer), the target region has an area that is at least as large as a structural feature size. Simply stated, the baseline volume per unit area is to produce blanket ink coverage over throughout a region of interest (i.e., a "target region") where the layer is to have uniform height with as few defects or aberrations as possible. Generally speaking, droplets spread out in dependence on ink viscosity, surface energy, chemistry and geography and other characteristics, typically according to a time characteristic; following a spreading time, the printed liquid then becomes substantially stable, and is then processed to cure or otherwise harden, cure or otherwise convert the ink into a permanent structure of an electronic device.

In order to improve layer homogeneity, smoothness, printing time and other layer characteristics, the system plans printing according to principles discussed herein (117). This planning can include adjustment of the baseline volume per unit area or other print process parameters according to techniques discussed herein. In one optional embodiment, as introduced above, a scan filter (118) can be utilized to interleave droplets across multiple scans (in order that droplets coalesce in a manner that is more predictable) and this filter and/or pattern (or density) can optionally be adjusted (121) in order to account for nozzle error and/or other process variation. As an example, if individual nozzles and/or combinations of specific nozzles with specific drive waveforms ("nozzle-waveform combinations") produce aberration (123) relative to droplets from other nozzles, this can be specifically measured in situ (125) and applied to adjust the scan filter or otherwise adjust the droplet deposition pattern (121). In another optional embodiment, nozzles-waveform combination particulars are dynamically measured and remeasured to develop statistical populations of measurement, and to so-derive means and spread measures (e.g., variance, standard deviation, 3-sigma measures, etc.) for droplet volume and/or droplet landing position, so as to account for changing conditions (e.g., ink viscosity, temperature, nozzle clogging, and many other possible process parameters); these values can be stored in system-accessible memory (127) for use in the print planning process (117), selection of a scan filter (118), or the adjustment processes (121) just described. In yet another optional embodiment, a droplet firing signal (or nozzle pitch) can be adjusted, for example, by adjusting a trigger signal frequency or a delay value or by rotating the print head (and thereby effectively change print grid spacing), and so applied so as to vary baseline volume per unit area or other print process particulars. Other configuration and/or forms of adjustment are also possible, and any of these techniques can be mixed and matched with each other and are to be considered optional features relative to each other. When planning is complete, the result is a set of control data (129) that can be stored in system memory (127) and/or immediately applied to printing; for example, as referenced above, printing can be performed according to the control data (i.e., according to the adjusted filter/data, as reference by numeral 131, upon a new substrate 132). The substrate can then be advanced, as appropriate, for processing (curing or other processing), 133, and otherwise finished (135). Depending on application, each substrate can ultimately be formed into a dedicated product (such as a single large HDTV screen, for example), or can be fabricated as an array of panels, which are then cut into multiple electronic panel devices, per numeral 137.

Note that it was indicated earlier that spreading characteristics can in one implementation be measured in advance. In one embodiment, this measurement can be performed using one or more test deposition processes on test substrates, that ideally use the same printer, ink, print head, deposition environment, temperature, and other process factors that will be used in an assembly-line setting. That is, since process corners can vary from application-to-application and equipment-to-equipment, in one embodiment, an installation of a fabrication device uses ink that will be used during assembly-line style fabrication is used in situ in one or more test runs and then subjected to automatic (e.g., image-based) or manual analysis in order to measure spreading parameters; these measured parameters can then be programmed into the system or otherwise applied in the manner indicated herein; if desired, even for a fixed fab application, measurement can be reperformed over time to account for changing process conditions (e.g., equipment wear, ink variation, change in temperature, or other factors). As noted earlier, the use of measured parameters (and/or measured statistical parameters based on multiple test runs) is not required for all embodiments.

Figure 2A:
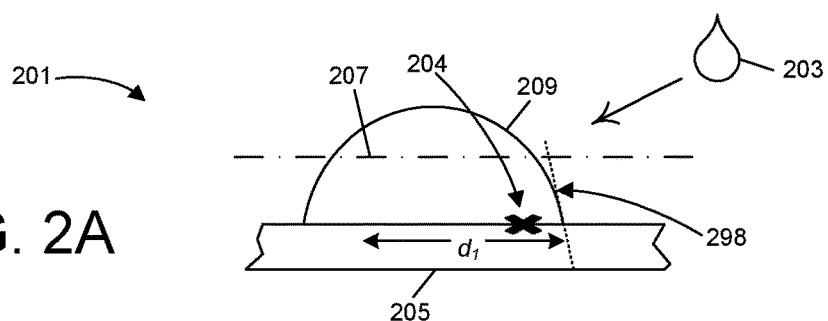
FIG. 2A is an illustrative view of a droplet (209) of liquid from a printer just after droplet has established contact with a substrate (205); a desired thickness of the film is represented by a horizontal line 207 and effective diameter of the droplet's contact area is represented by "$d_1$."

With some basic processes thus introduced, it would be helpful at this point to explore some characteristics of ink printing for industrial fabrication where the ink will become a permanent structural component of an electronic device. The example application that will be used for these discussions is the fabrication of an organic LED ("OLED") display panel; as noted earlier, however, the techniques discussed herein are not so limited. Contrasted with the printing of a liquid that will be absorbed into media (e.g. paper, to impart a specific color property and thus for most applications becomes "dimensionless"), these applications deposit a liquid that for the most part not absorbed into a support medium, but rather which is to retain structural characteristics such as height that will be processed to form a desired structural layer (e.g., such as by curing a deposited monomer liquid in situ to form a polymer layer with specifically planned thickness). FIG. 2A is used to introduce such a deposition process, via a depiction that is generally designated by numeral 201.

More specifically, a droplet 203 of liquid ink will be jetted from an ink jet printer and "aimed" at a specific desired landing position 204 on a substrate 205 ("x' marks the spot"). The substrate can be any desired support media, e.g., glass, metal or another substance, with or without other layers already deposited to create an underlying surface geometry; for example, the surface onto which the droplets are deposited can be any type of structure or layer stack, with potentially complex chemistry and/or geometry. The droplet flattens somewhat on impact, as represented by numeral 209 and (notably) may land slightly off relative to the specific desired landing position 204, depending on process corners for the particular fab process, nozzle, print head, drive electronics, etc. This type of aberration will be elaborated on below. Note that a desired, ultimate layer height is represented by line 207 and that, as the droplet lands, it has a diameter of impact that corresponds to area of the substrate that is covered by the droplet, denoted by value "$d_1$;" this droplet coverage area is modeled as a circle, but note that droplets in practice can land in many different shapes (e.g., elliptical, teardrop shaped, and so forth)—the notion of a circular impact area will be used in the context of FIGS. 2A-E simply for illustration and explanation.

After droplet impact, the droplet will "settle" and spread slightly according to a time decay function, i.e., the droplet lands with a shape modeled by the depiction of FIG. 2A, and it then flattens out (or "spreads") according to properties such as ink viscosity, surface energy of the substrate and/or any underlying surface geometries, temperature, ink surface tension and other parameters.

Figure 2B:
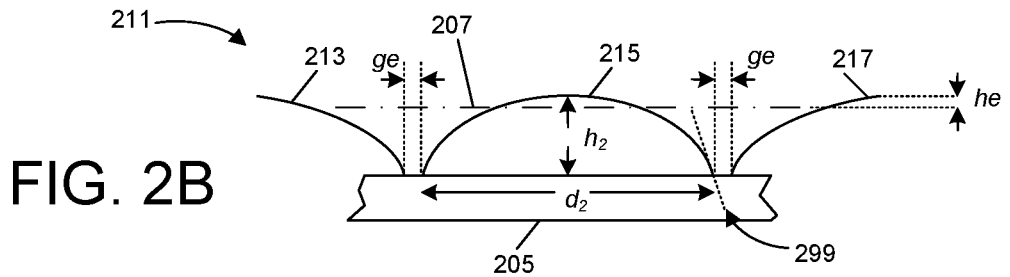
FIG. 2B is an illustrative view similar to FIG. 2A, but where droplets (213, 215 and 217) following spreading are both "too thick" and are "too far apart," resulting in height error ("he") and gap error ("ge"); in this FIG., droplet effective diameter is represented by "$d_2$" while maximum droplet height is represented by "$h_2$."

FIG. 2B provides a depiction (211) where three droplets (213, 215 and 217) have been deposited on substrate 205 and allowed to settle—each droplet is seen to have a maximum height ("$h_2$") following spreading and a diameter ("$d_2$"), representing the amount of the substrate covered by the droplet. As depicted in this FIG., the deposited droplets do not contact each other and meld and, so, result in gap errors ("ge") that represent voids and other defects in the resultant structural layer. Also, FIG. 2B shows that droplet height ("$h_2$") is greater at some places than the desired layer height (represented by line 207) and, so, produces a layer that is too thick at some places and too thin at other places. This type of deposition can be unacceptable for many applications, e.g., for electronics applications, current flow through the deposited layer can be impeded or shorted by the depicted voids, and otherwise give rise to irregularities. For color filter applications (e.g., back-lit displays) and light-emitting layers, these aberrations can result in color variations and so give rise to line-effect and other undesired defects in a resultant display device. For encapsulation applications, these aberrations can expose sensitive electronic components to moisture, oxygen or other damaging contaminants, and so denigrate device lifetime. Other issues can also be created, depending on application, e.g., if the layer is to be a smoothing layer or barrier, the result can be a smoothing layer that is not smooth or otherwise does not provide an effective barrier.

Figure 2C:
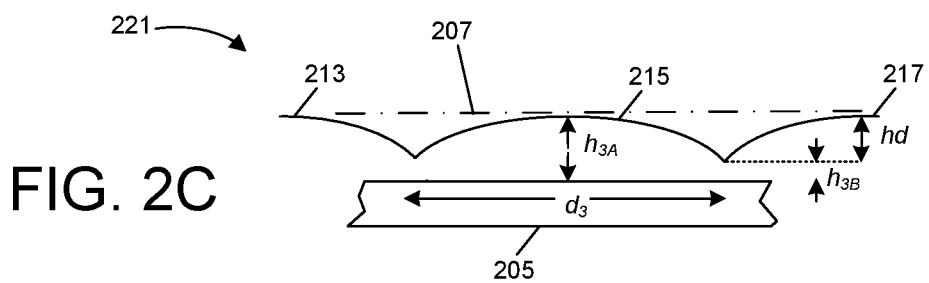
FIG. 2C is an illustrative view similar to FIG. 2B; here, droplets have spread and melded so as to provide for a continuous film having height differences ("hd") relative to the desired thin film thickness (207); droplet effective diameter is represented by "$d_3$" while maximum droplet height is represented by "$h_{3,4}$."

FIG. 2C provides a depiction 221 similar to the one just described, but where the droplets have spread to a greater degree ("$d_3$"), now have a height ("$h_3$") that is less than the desired layer thickness 207, and have melded to an extent where there are no more gaps or void defects; thus, these droplet and process particulars are now potentially suitable for use in producing the desired layer thickness 207. Note that the depicted maximum droplet height ("$h_3$") is "close to" the desired layer thickness 207 and, thus, with appropriate "halftone" selection (e.g., including droplet density adjustment or other volume per unit area adjustment), the layer parameters can be adjusted in order to "scale" the maximum thickness to be roughly equal to the desired layer height 207. However, the depicted droplets 213, 215 and 217, while spreading and melding, still do so only to a limited extent, and thus produce a surface roughness, represented in this FIG. by peaks (having maximum height "$h_{3A}$"), valleys (having minimum height "$h_{3B}$"), and a range of height differences corresponding to variation ("$h_d$") between these two extremes. The depicted layer is suboptimal as, due to the surface roughness, parts of the deposited layer will be too thick and/or too thin (and potentially represent points of weakness where oxygen or moisture might penetrate the layer, or where other defects as discussed above might be engendered). Note that a manufacturer's specification typically sets a maximum acceptable roughness or height variation permitted for a deposited layer, and this criteria can be used in a particular application to determine the extent to which roughness (e.g., as depicted in FIG. 2C) can be deemed acceptable or excessive. However, even within a manufacturer's specified tolerance, non-uniformity can lead to optical or electrical variations that negatively impact device performance, potentially creating optical (or other) distortions in an electronic display or other light emitting device.

Figure 2D:
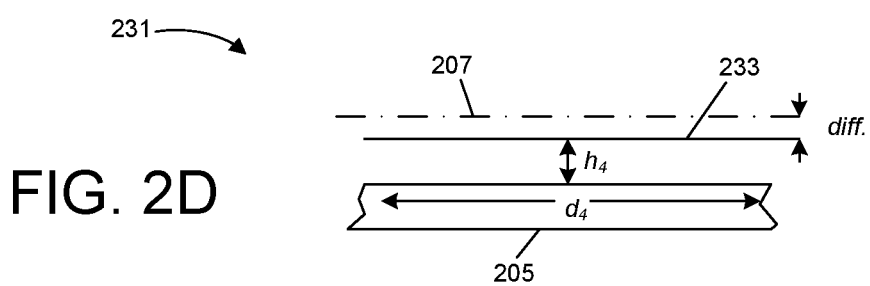
FIG. 2D is an illustrative view similar to FIG. 2C; here, droplets have spread and melded even to a greater degree, so that a layer (223) is uniform, and is a reasonable approximation of desired thin film thickness (207); droplet contact area effective diameter following spreading is effectively represented by "$d_4$."

FIG. 2D represents a layer 233 (via depiction 231) corresponding to print process particulars that are well-suited to producing the desired layer 207. That is, as seen, the deposited droplets spread so much (i.e., having dot gain represented by "$d_4$") that the deposited layer 233 is completely flat and has a height ("$h_4$") that is a reasonable approximation of the desired layer height 207. That is, assuming that the volume per unit area is less than maximum (e.g., a droplet density that does not use all droplet firing points), the volume per unit area can be readily "scaled" so as to increase height ("$h_4$") to exactly match the desired layer thickness; for example, if the depicted value ("$h_4$") is 60% of the desired layer height (207), and a droplet density that produces height ("$h_4$") is sufficiently less than maximum droplet density, then increasing the droplet density by two-thirds should exactly produce the desired layer. Because the top surface of the layer is flat, and lacks the surface roughness depicted in FIG. 2C, the depiction of FIG. 2D represents an optimal layer that is much less subject to defects than the aforementioned examples. Note also that, if the volume per unit area represented by the FIG. is near the maximum density supported by the print grid, additional scans can be added to the print process to produce the desired thickness following cure, if such is permissible within any manufacturing timing budget (e.g., using additional scans to deposit ink at a volume per unit area that is greater than the maximum obtainable with a single scan).

Figure 2E:
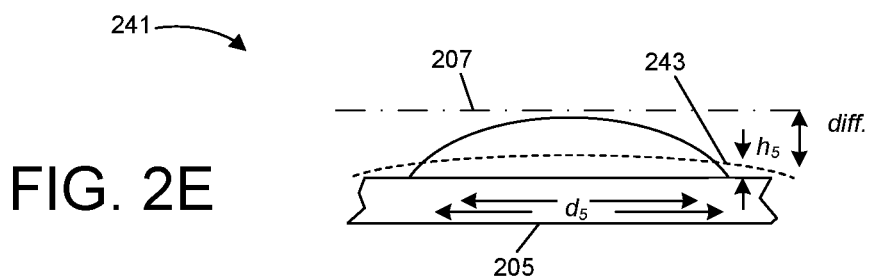
FIG. 2E is an illustrative view similar to FIG. 2D; here, droplets have spread or otherwise been deposited so as to form a uniform layer (223), but have taken a very long time to "settle" (i.e., to completely spread, conceptually represented by two illustrated droplets and changing diameter arrows "$d_5$;" it may be difficult to form the desired film thickness in a reasonable amount of time.

Finally, FIG. 2E provides a depiction 241 where a layer 243 has an excessive settling time (i.e., depicted as ultimately settling to height "$h_5$"). In this FIG., layer thickness is not the issue, but rather, solid and dashed line droplets and variable diameter "$d_5$" are illustrated to connote that a very long deposition process will be ultimately required. In this regard, it should be noted that many consumer products have extremely sensitive price points, e.g., if a deposition (e.g., printing) process takes too long, this then increases per-product manufacturing cost; the resultant (increased) product price point can make a substantial difference in consumer demand, as for example, whether the purchasing public is to purchase a flat panel OLED TV or a competing technology. Generally speaking, in the context of current manufacturing applications envisioned by this disclosure, it is contemplated that the illustrated systems and processes must be able to print a liquid layer over a "room-sized" substrate in less than about 120 seconds in order to be commercially viable relative to other technologies; for future product generations, this time is expected to be significantly less (e.g., 45 seconds or less). Thus, the deposition particulars represented by FIG. 2E and its associated description are less desirable than those represented by FIG. 2D and its associated description, because FIG. 2D is associated with a generally much faster overall print process.

These considerations are not the only ones that affect ability of a print process to produce a desired layer. FIGS. 3A-3E are used to introduce other considerations pertinent to some of the techniques described herein. Generally speaking, each of these FIGS. depicts a print head 303 and a print grid 305, the latter having vertical axes (e.g., 306) and horizontal axes (e.g., 307) that define nodes at their crossing points, each of which can be a location at which an ink droplet can potentially be printed during a scanning motion (304) of the print head 303 relative to a substrate (not seen in FIG. 3A). The spacing between vertical axes represents nozzle pitch, which can be manifested in a number of ways: For example, in one embodiment, a single print head can be used, and the spacing between adjacent nozzles of the printhead determines this "cross-scan pitch" ("$\Delta x$," e.g., between nozzles 1, 2, 3, 4, 5 etc.); in yet another embodiment, the depicted printhead can be moved, e.g., in between successive scans, some incremental distance—for example, if nozzles are 100 microns apart, but the printhead can be moved in the "horizontal" direction in increments of 25 microns, then the "cross-scan pitch" would be 25 microns, with multiple scans being used to obtain the 25 micron spacing between droplets; in yet a third variation, multiple printheads can be used (e.g., each being offset from one another in the "horizontal direction" by some amount (e.g., 25 microns) in order to obtain this same effect during a single scan; and in a fourth variation, the printhead(s) can be rotated to effective adjust the "cross-scan pitch." Each of these options is collectively represented in these FIGS. by a unitary printhead depiction for purposes of ease of illustration, but it should be understood that each of these options is represented by the depicted printhead and that, whatever design is used, effective nozzle spacing for purposes of scanning is modeled as a cross-scan pitch. During a scan, the print head also moves a certain distance (304) per unit time ("$\Delta t$"), thereby defining a scanning velocity; as the print head moves, nozzle firing signals can be triggered by a digital clock with a maximum firing frequency that defines an "in-scan pitch" (represented as "$\Delta y$" in the FIGS. and associated separation between horizontal axes); again, it should be understood that there are also other designs for placing droplets at "vertical intervals" along the depicted print grid, and that FIGS. 3A-E should be viewed as encompassing these various options.

Figure 3A:
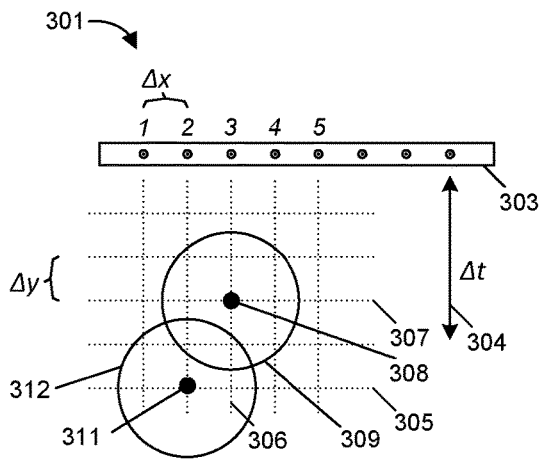
FIG. 3A is an illustrative diagram showing a hypothetical print grid 305 and possible landing locations of droplets during printing; two idealized droplet landing locations 308 and 311 are designated, having respective spreading represented by circles (numbered 309 and 312).

FIG. 3A shows a depiction 301 where droplets are fired at two nodes, 308 and 311, with droplets assumed to land exactly as planned at the depicted locations (308 and 311) and assumed to have dot gain corresponding to circles 309 and 312. The depicted droplets will impact the substrate, spread as previously indicated, and meld together, ideally, at the areas of overlap of depicted dot gain (i.e., where circle 309 meets circle 312).

Figure 3B:
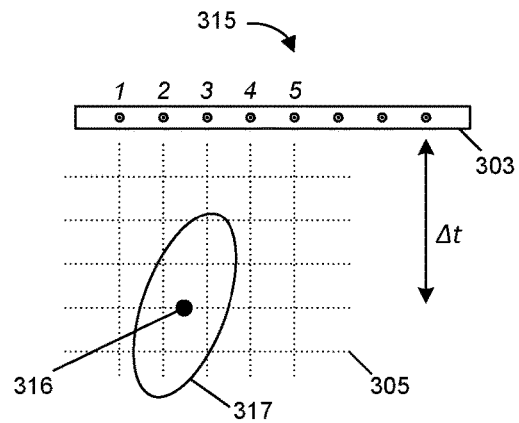
FIG. 3B is an illustrative diagram similar to FIG. 3A, but that shows undesired wicking of the centers of droplets from FIG. 3A to instead have an effective center at 316, with dot gain 317 and coverage area that are potentially unpredictable.

In practice however, surface energy, liquid surface tension of the ink and others of the parameters mentioned earlier can influence how droplets meld together and can lead to unpredictable results. This is illustrated in FIG. 3B, in a depiction generally designated by reference numeral 315. That is, rather than having ink which covers the substrates as represented by the union of circles 309 and 312 from FIG. 3A, the droplets can draw (e.g., "wick") each other out of position, creating in this example an effective droplet center at 316 (which does not correspond to a print grid node location, and which instead represents an unpredictable location and coverage, represented by ellipse 317); if it was wrongly assumed the droplets would provide coverage as indicates by the union of circles 309 and 312 in FIG. 3A, the actual union represented by FIG. 3B could also result in defects such as voids/gaps, excessive thickness and surface roughness and so forth.

Figure 3C:
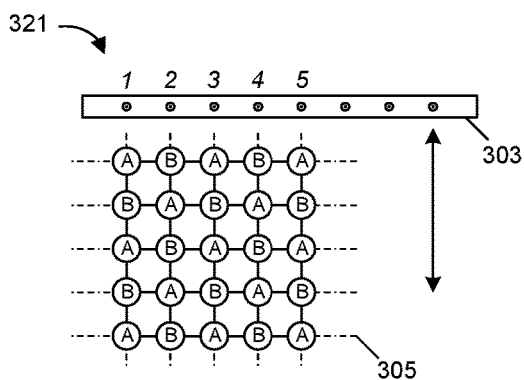
FIG. 3C is an illustrative diagram showing how droplet deposition can be interleaved, so as to inhibit the undesired wicking.

FIG. 3C provides a depiction 321 used to illustrate a potential solution to this problem, one that interleaves (i.e., distributes) droplet landing locations in the manner depicted by circles (droplets) labeled "A" and by circles (droplets) labeled "B" in a specific manner into different scans. Droplets labeled "A" are deposited in a first pass of the print head 303 relative to the substrate and droplets in between (labeled "B") are deposited in a second pass of the print head 303 relative to the substrate. In this manner, droplets labeled "A" by themselves do not meld (or meld weakly), and droplets labeled "B" are then later added so as to be positioned between "A" droplets (and much more closely to "A" droplets than other "A" droplets) and so-trigger melding of surrounding droplets at the same time, in a manner that reduces the likelihood of undesirable wicking. The properties of the liquid ink (and any other pertinent factors) are such that, because of this interleaving and concurrent melding with low-density droplets deposited in pass "A," the intended centers of the various droplets do not substantially change. That is, relative to the example of FIG. 3B, a "B" droplet melds with multiple neighbors simultaneously and does not lead to unpredictable or undesired "wicking" of a deposited droplet. Note that in this example, it is assumed that the print grids for scan "A" and scan "B" are identical, that only two scans are used (e.g., it is possible to use three or more scans to interleave droplets), and that droplet sizes in passes "A" and "B" are identical, but none of these things are required for any embodiment. That is, for example, contemplated variations feature droplet sizes in passes "A" and "B" being deliberately selected to be different (e.g., droplets in pass "A" having a volume three times that of pass "B"), the use of multiple droplets at some locations (e.g., at node locations labeled "A"), and/or the use of three or more scans; indeed, many such variations are possible.

Figure 3E:
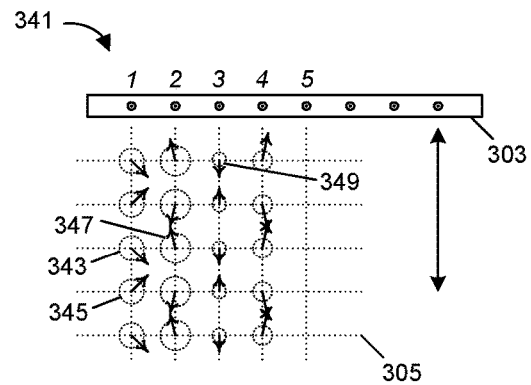
FIG. 3E is an illustrative diagram representing unintended droplet volume variation (difference in depicted dot gains for respective droplets, e.g., represented by "circles" numbered 343, 345, 347 and 349), and trajectory offset and variation (represented by arrows shown for each deposited droplet).
Figure 3D:
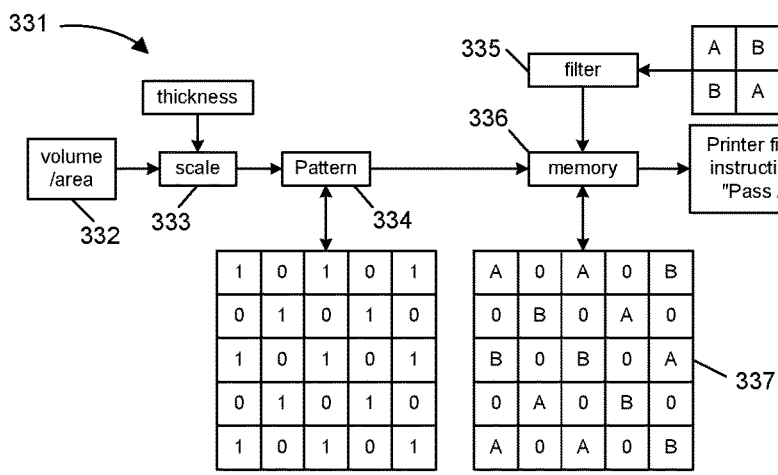
FIG. 3D is an illustrative diagram showing how a filter (335) can be applied to a droplet deposition pattern (334) to perform interleaving (see FIG. 3C).

FIG. 3D shows one possible method for performing interleaving, generally designated by numeral 331. Once again, the described techniques can be embodied as an apparatus or system, and can be embodied in the form of instructions stored on non-transitory, machine-readable media (e.g., software). The method first identifies or retrieves a baseline volume per unit area 332, for example, a density of specific volume droplets, or combination of droplets of different volumes, computed according to the principles discussed earlier and stored into machine-accessible digital memory. This volume per unit area or a corresponding droplet volume/firing pattern can be selected so as to produce a "blanket" layer of minimum thickness within constraints such as those discussed above (e.g., the thinnest layer that can be printed using available droplet size while providing blanket coverage, that is, with no voids in the resultant liquid coat, following settling and melding). This baseline will then be scaled in order to produce the right amount of thickness corresponding to the intended layer. In one embodiment, the intended layer formed from the liquid ink is five microns or less, and in other embodiments, it is four microns or less, three microns or less, two microns or less, or one micron or less, etc. For example, per the principles discussed earlier, if a given baseline volume per unit area of "two 10.0 picoliter (pL) droplets per square millimeter" would produce a one micron-thick layer with complete coverage and a 1.60 micron-thick layer is desired, the baseline volume per unit area could be scaled to "3.2-10.0 pL droplets per square millimeter." An interim deposition pattern is then generated (334) for the printable area of the substrate (e.g., with the print pattern selected to print droplets only in those regions of the substrate where a product is being formed). In one preferred embodiment, this pattern is generated by calling a "halftoning" subroutine (i.e., as a software module) which receives printable area definition (e.g., height and width) and print head particulars (e.g., nozzle-pitch, print grid particulars, and so forth) and the scaled density (e.g., "3.2-10 pL droplets per square millimeter") and returns droplet pattern information that equates to nozzle firing decisions for the print grid overlaid against the printable area of the substrate. In contemplated variations, as noted above, (a) droplet sizes can be scaled instead of or in addition to numbers of droplets (e.g., the scaled value could be "two-32.0 pL droplets per square millimeter," or "ten-3.20 pL droplets per square millimeter," and/or (b) the print grid can be effectively adjusted (e.g., "two-10.0 pL droplets per 0.3125 mm$^2$," i.e., by effectively keeping an existing droplet pattern but changing the print grid density, and/or (c) multiple droplet sizes can be used together in a single scan, and/or (d) other techniques can be used. The use of a subroutine to calculate firing instructions (e.g., to select nozzles for firing so as to spatially distribute droplets) is known, as introduced by U.S. Pat. No. 8,995,022 (which has already been incorporated by reference); in effect, a desired parameter is specified (e.g., "ten-3.20 pL droplets per square millimeter") and the software returns a firing map which spatially distributes the requested droplets; the pattern produced by such software is effectively represented by numeral 334 in FIG. 3D, but it should be noted that the software can also be integrated with the other depicted functions (e.g., droplet size selection and/or interleaving, the latter represented by the use of a filter 335).

Continuing with this narrative, FIG. 3D illustrates for purposes of illustration and explanation a hypothetical pattern of "1"s and "0"s for a hypothetical print grid having five rows and five columns (i.e., as an interim deposition pattern); it should be understood despite this simplified example that in practice, a print grid will have thousands of rows and thousands of columns. In the depicted matrix, "1"s represent decisions that the pertinent nozzle will be "fired" at the corresponding print grid location (node), whereas "0"s represent decisions that the pertinent nozzle will not be "fired" at the corresponding print grid location. As indicated by numeral 335, an interleaving filter (represented as A, B/B, A) is applied to the interim deposition pattern in order to sort nozzle firings to respective scans. This filter, exemplified as a 2×2 matrix in this example, is applied to the digital firing decisions (i.e., the 1's and 0's of the print grid firing pattern) to simply distribute adjacent droplets in each column of the print grid to respective scans. Note that may other types of filters can be applied, and much more complex filters can be used (for example, with reference to adjusted print grid firing decisions 337, it is noted that the lower left corner features "A" pass droplets near each other, which might provide for suboptimal droplet distribution—a more robust filter can be used so that sparse droplets are interleaved with even greater precision). Whichever type of filter or process for interleaving deposition is used, one or more processors under the control of software can operate on an interim deposition pattern (334) as stored in memory 336 and apply the digital filter pertinent to the design (i.e., filter 335) to the stored data in order to automatically transform that stored data using matrix math. The result (337) is again stored in memory. There are clearly many alternatives for performing this transformation, e.g., in another embodiment, the halftoning subroutine can be called a first time and passed a scaled density (e.g., of "1.60 droplets per square millimeter"), to identify a first pass droplet deposition pattern, and then called a second time with a positional or similar offset (e.g., and passed the same scaled density for a second pass). Note again that use of a digital filter is not required for all embodiments. As indicated by the right side of FIG. 3D, the result then is a set of firing instructions for a first scan ("A"), a set of firing decisions for a second scan ("B"), and possibly sets of firing decisions for further scans (i.e., as denoted by the presence of ellipses 339). The stored/modified data can thereafter be applied to a printer to control printing and to create a physical device having a layer with physical structural properties conferred by/dictated by the described techniques, with interleaving as described applied to improve droplet melding and thus help promote formation of a more uniform layer; again, this can be of great assistance in improving the fabrication of electronic devices predicated on thin layers.

Depending on embodiment, additional measures can also be taken to further enhance layer homogeneity. For example, FIG. 3E shows an example 341 of hypothetical per-nozzle error in terms of deposited droplets. That is, unintended variation in droplet sizes (represented as differently-sized circles, e.g., 345, 347 and 349) and errors in landing position (compare trajectory and landing position, depicted by arrows, for droplet 343 relative to droplet 345), could potentially impede layer homogeneity.

More specifically, FIG. 3E shows hypothetical, repeatable droplet or nozzle firing error for each of nozzles 1-5 of the print head; expected droplet volume is represented by a circle centered on a print grid node position (e.g., circle 343), while expected droplet landing position and/or firing trajectory is represented by arrows originating at each print grid node position. Nozzle 1 is seen in this FIG. to produce droplets having a median expected volume (e.g., of 10.04 picoLiters or "pL") per pass, with a trajectory that is slightly off-center to the right. Note that this FIG. represents use of the droplet-interleaving techniques introduced relative to FIG. 3C, above, e.g., one droplet (343) from nozzle 1 is seen as having a downward-to-the-right trajectory as part of "scan A," while the next droplet (345) from the same nozzle is seen as having an upward-to-the-right trajectory as part of "scan B" (i.e., as the print head/substrate are being relatively moved in the opposite sense relative to the direction of "scan A"). A droplet (347) from nozzle 2 is seen to have a larger expected volume than nozzle 1 (e.g., 10.47 pL), but greater expected velocity error and relatively slight lateral error (e.g., slightly "to-the-left" relative to droplets from nozzle 1). A droplet (349) from nozzle 3 produces droplets with smaller expected volume (e.g., 9.03 pL), low expected velocity and no expected left-to-right lean, relative to droplets from nozzles 1 or 2. FIG. 3E shows no depicted droplets from nozzle 5, i.e., representing the fact that in this hypothetical, nozzle 5 is inoperative, and thus does not produce droplets as it is supposed to. Depending on the degree of deviation from desired droplet parameters, deposition using these droplets might create issues for extremely thin layers.

To address these unintended variations, in one embodiment, these errors are actually leveraged in generating print droplet firing patterns, i.e., such that expected per-nozzle droplet volume and/or landing position error is identified and actually relied upon (e.g., by a halftoning subroutine or other software) to produce a distributed droplet pattern and/or droplet sizes where the per-nozzle or per-waveform errors in droplet size and landing position are taken into account in planning which nozzles will fire, when those nozzles will be fired, and which nozzle drive waveforms or instructions will be used; this enhances smooth layer formation and minimizes "wicking" and other issues. These various errors can be used to produce or adjust the print grid firing decisions (interim or final) and/or scans/scan positions, or to adjust the filter in order to pre-distort the firing map to leverage these expected variations.

FIGS. 4A-D provide further examples which illustrate how such unintended error/variation can be accommodated and/or reduced.

Figure 4A:
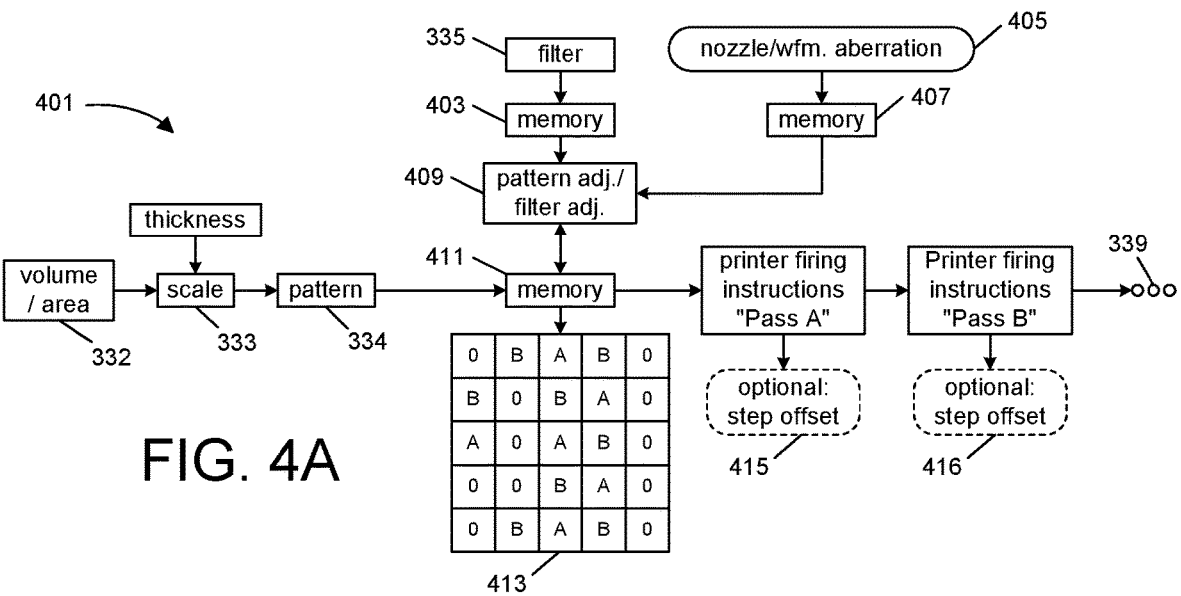
FIG. 4A is an illustrative diagram similar to FIG. 3E, but which shows pattern/filter adjustment (509) so as to pre-distort the interleaving pattern so as to accommodate droplet volume variation and/or offset and trajectory variation (i.e., such that interleaving, as desired, will result in the proper ordering and positioning of droplets, even with the aforementioned variation).

FIG. 4A shows another possible method for performing droplet interleaving, generally designated by numeral 401. This method is similar to the one described above in connection with FIG. 3E, with like steps described using like reference numbers. These techniques can once again be embodied as an apparatus or system, and can be embodied in the form of instructions stored on non-transitory, machine-readable media (e.g., software). The method first identifies or retrieves a baseline volume per unit area (332), for example, computed according to the principles discussed earlier and stored into machine-accessible digital memory. This volume per unit area can be represented as a minimum number of droplets of given size per unit area, or a pattern of droplets, or as a raw volume, or in some other manner, selected so as to produce a "blanket layer" of the baseline thickness within a minimum scan time or number of print head scans (relative to substrate). This quantity is then scaled (333) or adjusted in view of desired thickness (e.g., by the ratio of desired thickness to the baseline thickness of the processed, permanent layer). In one hypothetical embodiment, the baseline thickness might be a one micron thick layer and the final thickness of the desired layer might be, e.g., 3.2 microns; for example, per the principles discussed earlier, if a given baseline density of "two-10.0 pL droplets per square millimeter" will produce a one micron-thick layer with complete coverage and a 1.60 micron-thick layer is desired, the baseline density could be scaled to "3.2 droplets per square millimeter" or some mathematical equivalent. An interim deposition pattern is then generated (334) for the entire printable area of the substrate. In one preferred embodiment, this pattern is generated by calling a "halftoning" subroutine (i.e., as a software module) which receives printable area definition (e.g., height and width) and print head particulars (e.g., nozzle-pitch, print grid particulars, and so forth) and the scaled volume/area or droplet density (e.g., "3.2 droplets per square millimeter") and returns droplet pattern information that equates to nozzle firing decisions for the print grid overlaid against the printable area of the substrate.

As indicated by numeral 335, an interleaving filter can then once again be applied to the interim deposition pattern in order to sort nozzle firings to respective scans. This filter can be stored in machine-accessible memory 403. Compiled (e.g., in situ-measured) nozzle-to-nozzle or nozzle-waveform-combination-to-nozzle-waveform-combination aberration can also be stored in machine-accessible memory (407) and retrieved and used to adjust and/or create the stored filter (and/or interim deposition pattern), as represented by numeral 409. The results of this process can then be stored in digital memory 411 (e.g., this can be the same memory or different memory as designated by numerals 403 and 407, and represents a transformation of at least some of the data previously stored in memory). Once again, nearly any type of filter can be applied to sort the droplet deposition pattern(s) into multiple scans so as to "interleave" droplet deposition. In this embodiment, one or more processors under the control of software can operate on the interim deposition pattern (334) as stored in memory 411, and apply the digital filter pertinent to the design (i.e., filter 335) to the stored data in order to automatically transform that stored data using matrix math, with the result (413) being re-stored in memory or used to overwrite the original firing decisions. As was true before, here also there are many alternatives for performing the referenced transformation of droplet data and associated sorting of droplet firing responsibility to multiple scans. This is indicated by the right side of FIG. 4A by the depiction of a set of firing instructions for a first scan ("A"), a set of firing decisions for a second scan ("B"), and possible sets of firing decisions for further scans (i.e., represented by ellipses 339). Because the referenced aberration does not necessarily "cleanly" align with print grid pitch, in one embodiment, any scan can be offset a fractional amount by repositioning of the print head in the cross-scan dimension; for example, as indicated by optional process blocks 415 and 416, the print head can be incrementally advanced by a "step offset" for each of or both of the "A" and "B" (or other scans). In this regard, one optional design for a printer mechanism includes a stepper motor to move the print head in the cross-scan dimension by very small amounts e.g., micron scale increments. Given that for many equipment implementations the minimum print grid cross-scan pitch will be twenty microns or more, this "fine adjustment" ability provides for greatly increased sophistication in positioning droplets so as to provide for droplet coalescence with less aberration and for production of a more homogeneous layer.

Once again, it is noted that the techniques discussed above can be implemented in many different manners, including as software that controls one or more processors to (a) receive per-nozzle or per-nozzle-waveform-combination droplet data, (b) plan droplet positioning and/or droplet selection in a manner dependent on variations represented by the received data, so as to rely on these variations to position droplets in a manner that will result in more homogenous layers, and/or (c) adjust print parameters as necessary so as to obtain a deposited layer of liquid ink (and a hardened layer) with improved homogeneity using faster print time.

Figure 4B:
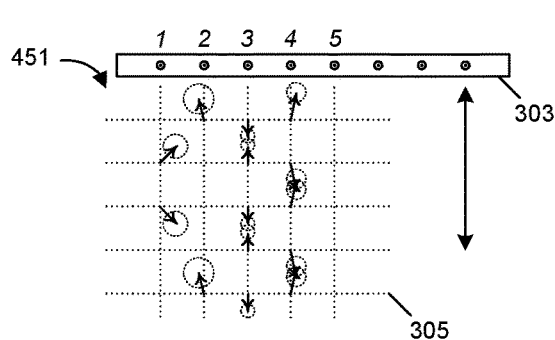
FIG. 4B is a hypothetical droplet deposition pattern showing the landing position (and volume/density) of deposited droplets which have been interleaved using the adjustment techniques of FIG. 4A, with droplets effectively selected so as to compensate for unintended droplet variation across nozzles (e.g., droplet size variation, or nozzles which do not fire at all, such as "nozzle no. 5").

FIG. 4B illustrates a hypothetical print pattern (451) similar to the one discussed above in connection with FIG. 3E, but which has been planned or re-planned in a manner dependent on variation in droplet particulars. Note that unlike FIG. 3E, the circles representing deposited droplet volumes are now depicted centered on landing location (rather than on print grid nodes) and are shown as representing a sparse print droplet pattern, in order to better illustrate homogeneity. More specifically, FIG. 4B once again shows a print head 303, a print grid 305, arrows representing droplet trajectory (for those droplets which are fired as part of the sparse print pattern). Two droplets are used from nozzle 1, two droplets from nozzle 2, and five from each of nozzles 3 and 4 to obtain a relatively homogenous ink density dependent on droplet expected volume and expected landing position variation. Use of only two droplets from nozzles 1 and 2 is correlated with the fact that these nozzles have been measure to produce larger droplets than nozzles 3 and 4, which conversely, each use droplets at a greater firing frequency. The two droplets from nozzle 1 in this example are interleaved to different scans (e.g., in dependence on their mirrored trajectories), whereas the two droplets from nozzle 2 in this example are sorted to the same scan (scan "B") in order to better distribute these droplets. To account for inability to produce droplets from nozzle 5, either additional scans (with print head offset or step in the cross-scan dimension) or relatively heavier use of droplets from nozzles 4 and 6 (the latter not called out in the FIG.) can be relied on to impart homogeneous ink density. As before, interleaving is used to deposit droplets for improved coalescence properties, but nozzle variations are also accounted for in the embodiment, leading to greater layer homogeneity. Once again, the depiction of this FIG. is provided as an illustration, for purposes of explanation, and design of a suitable filter (and adjustment process) for interleaving, which accounts for the aforementioned variation, is within the abilities of one of ordinary skill in the art, and will be highly dependent on implementation.

Figure 4C:
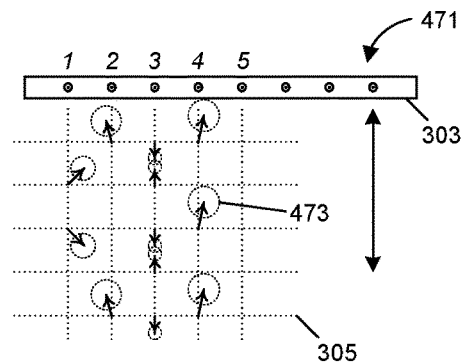
FIG. 4C is an illustrative diagram similar to FIG. 4B, but where select nozzles (e.g., "nozzle no. 4") have been selected to produce an extra-large droplet size (473), i.e., to effectively compensate for unintended droplet variation (e.g., inability of "nozzle no. 5" to fire droplets).

FIG. 4C provides an example 471 similar to the one presented in FIG. 4B, but which illustrates the deliberate variation of droplet sizes so as to promote layer homogeneity and accurate deposition of a homogeneous liquid coat; that is, comparing depicted droplet spread (and associated droplet volume) from nozzle 4 (designated by numeral 473) relative to a similar depiction in FIG. 4B, it should be noticed that the droplets in FIG. 4C are larger. In one embodiment, print planning or halftoning software, coded so as to factor in nozzle-to-nozzle variation, detects the need for greater volume deposition from nozzle 4 and responsively changes droplet size or a firing waveform to be used to create the droplet. In various embodiments, this added volume can be achieved through (a) multiple scan passes, (b) the use of "customized" nozzle drive waveforms (e.g., programming or changing the drive waveform for nozzle 4 to boost volume production, or change droplet trajectory), (c) the use of supported "scaled" droplet sizes (e.g., using a printhead which permits production of a "double" droplet volume, via application of a double-drive pulse), or (d) through other means.

Figure 4D:
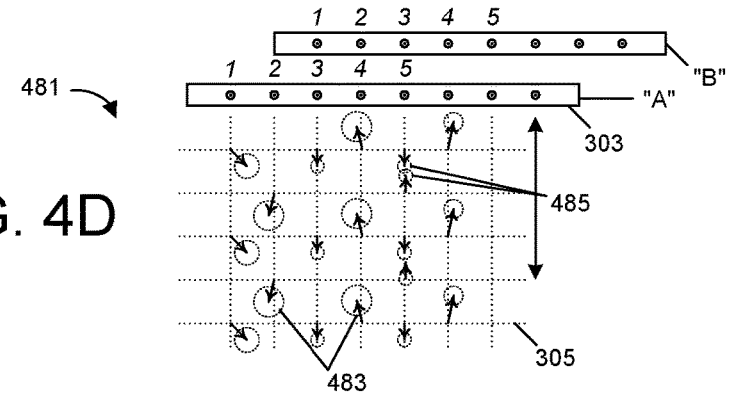
FIG. 4D is an illustrative diagram similar to FIG. 4B, but that shows the use of print head steps or offsets in between scans, so that the same nozzle can be used in multiple locations, and so that multiple nozzles can be used to deposition differently sized/ejected droplets at the same print grid location.

FIG. 4D illustrates a technique where multiple scan passes are applied with the print head incrementally offset between passes. Thus, in a first pass "A", during which the print head travels downward relative to the drawing page, nozzles 1-5 are controlled to produce droplets as represented by downward arrows. The print planning software then offsets print head position by moving the print head two positions to the right of the drawing page, such that nozzle 1 lines up with the position nozzle 3 had in the first pass; the print head is then moved in the opposite direction, in a second pass, depositing droplets (i.e., with associated per-nozzle volumes and/or trajectories) as represented by upward arrows. Each of the firing decisions and print head offsets is planned so as to interleave droplets as appropriate and provide for a homogeneous liquid coat (and processed layer). For example, nozzle 2 as depicted in this FIG. can be used in reciprocal scans to deposit droplets in two different positions (483) and conversely, nozzle 3 (and/or other nozzles) can be used to deposit overlapping droplets as desired (e.g., per numeral 485). In one embodiment, print head offsets, variations in droplet sizes and trajectories, engendered through techniques discussed herein, and interleaving, can be applied in three or more scans to provide for a high degree of deposition uniformity.

Figure 5A:
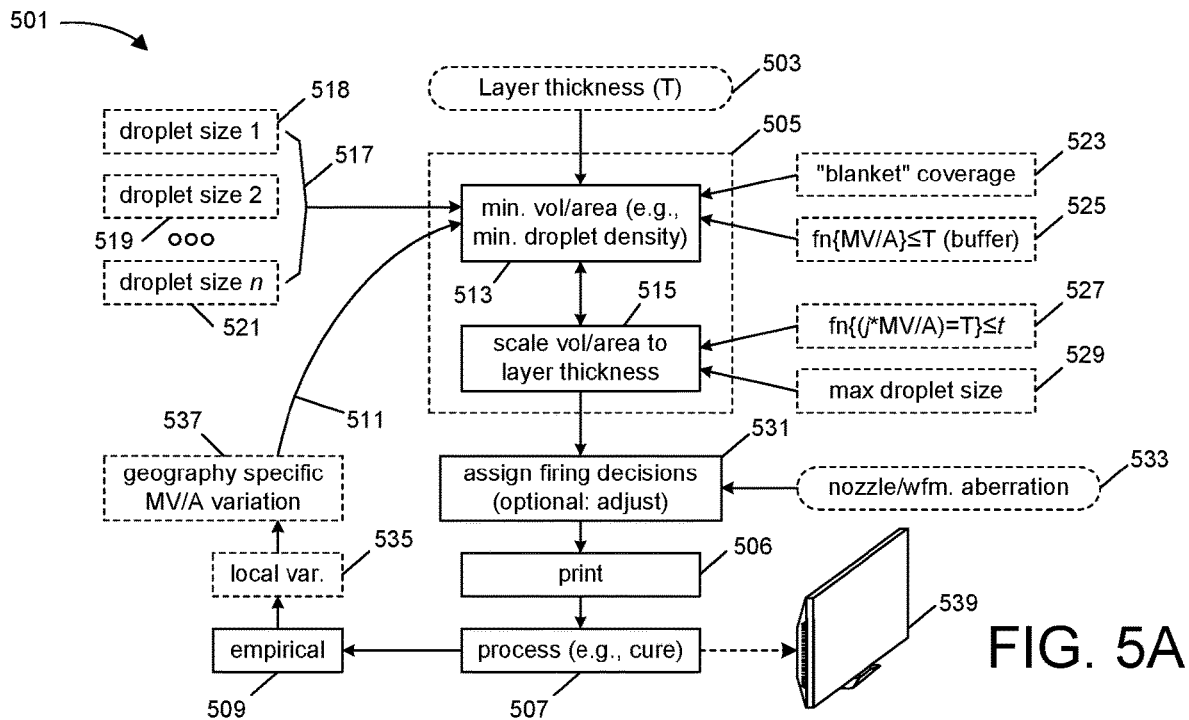
FIG. 5A is a flow diagram showing an embodiment of techniques for manufacturing thin films with improved homogeneity and print speed.

FIG. 5A represents yet another embodiment (501) of techniques that can be used to improve layer homogeneity and print speed. More specifically, the method starts with a specification for layer thickness, as denoted by numeral 503. A method, apparatus or system embodying these techniques then selects (505) fabrication process parameters for producing the layer of interest. The process parameters are then applied to print (506) a liquid ink onto a substrate, where the liquid ink will subsequently be processed (507) to cure or otherwise convert the liquid ink into a permanent structure. In one embodiment, the liquid is deposited as discrete droplets which settle and meld together, as previously described, to form a uniform liquid coat that carries an organic material; this liquid coat is then cured (e.g., via UV light exposure) or otherwise baked or dried so as to convert this liquid into a structural element of a light emitting device. Note that in an assembly-line style fab process where the same process will be used for many substrates, production tests can be initially performed on a test substrate to empirically measure (509) how ink droplets spread, and thus provide feedback (511) that can be used to define a suitable volume per unit area (513), or equivalent measure (e.g., density of droplets of predetermined size per unit area). As noted earlier, in one embodiment, the method can identify the lowest volume per unit area (e.g., pattern density of "10.0 pL" droplets) that will produce "blanket" liquid coverage of the region of interest given expected droplet spreading and other process parameters which still ensures that the given process parameters are capable of producing the desired layer (e.g., within pertinent specification parameters); this "baseline" can then be scaled (515) to produce the desired layer thickness. In one embodiment, these techniques are used to fabricate layers that are 5.0 microns or less in thickness, 4.0 microns or less in thickness, 3.0 microns or less in thickness, 2.0 microns or less than thickness, or 1.0 microns or less in thickness.

In one optional embodiment, collectively represented by numeral 517, the print infrastructure provides a capability of producing multiple discrete droplet sizes. In one version, multiple, different print heads can be used, each of which produces a respective, discrete droplet size. For example, one print head might produce a droplet of "approximately" 10.0 pL per droplet, another might produce 7.0 pL per droplet, another 4.5 pL per droplet, and so forth. In such an embodiment, each one of these is separately calibrated for droplet spreading characteristics and ability to produce a layer of desired thickness, and one of these is selected for use (assuming at least one of droplet sizes 1-n can produce the desired thickness). For example, as depicted, a first droplet size ("droplet size 1") 518 can be evaluated for ability to produce (a) blanket coverage (523) using droplet densities available to the particular print process, (b) a layer thickness that is less than or equal to thickness (T) regulated by specification (e.g., fn{MV/A(minimum volume/unit area)}≤T, as indicated by numeral 525 in the FIG.), and (c) ability to produce the thickness (T) regulated by specification using one or more scans, but within a maximum specified deposition time, t (e.g., fn{j*MV/A}≤t), as indicated by numeral 527 in the FIG. Note relative to numeral 525 that a buffer can be artificially injected, i.e., ideally, a droplet size that could only "just exactly" produced the desired thickness at minimum volume per unit area (MV/A) would not be selected if there were alternatives available, and ideally process particulars would provide some degree of buffer above the referenced minimum (needed to obtain blanket coverage), to accommodate nozzle variation, unanticipated errors and so forth (thus, the reference to "buffer" by process box 525 (i.e., fn{MV/A}≤T (buffer)). "Droplet size 2" (519) is then evaluated according to these criteria, and so on, through "droplet size n" (529). Following the evaluation of multiple droplet sizes, if multiple alternative "acceptable" droplet sizes could each be used pursuant to these tests then, in one optional embodiment, the one of these alternatives with the largest droplet size (529) is selected for use (e.g., such will minimize deposition time and otherwise enhance deposition speed). Other selection criteria can also or instead be used; as a non-limiting example, the droplet size which results in the smoothest layer could instead be selected—such a criterion might result in the smallest droplet size of the available alternatives being selected. Clearly other alternatives are also possible (e.g., the fastest deposition process). In other variations, a single print head can be used to produce multiple droplet sizes (e.g., using different, alternative waveforms applied to a given nozzle).

Whichever methodology is employed, based on use of a suitable, selected droplet size, firing decisions are then assigned to the print grid, per reference numeral 531. If desired, as referenced previously, nozzle-waveform combination aberration (533) in expected droplet volume or landing position (e.g., trajectory, velocity, nozzle bow, and/or other factors) can be taken into account (e.g., based on means or other statistical parameters, such as standard deviation or statistical variance) in planning the firing decisions; as this statement implies, in one embodiment, one nozzle-waveform combination might be used in lieu of another because, while the mean (i.e., expected volume or expected landing position) might not be optimal, the associated statistical variance (or other statistical parameter) is small. In embodiments where statistical populations are built for each nozzle (or nozzle-waveform combination), i.e., based on many measurements for each droplet parameter, to reduce effects of measurement error, many different statistical parameters can be calculated and applied in this manner. As indicated by reference numeral 531, the print pattern and/or filter and/or pattern selection can then be adjusted based on the indicated variation in nozzle-to-nozzle (or nozzle-waveform-combination-to-nozzle-waveform-combination) parameters.

Note that FIG. 5A indicates two further options that a designer may choose to implement, depending on application. First, a system can design the system to provide local (i.e., intra-substrate) variation in layer parameters (535) and associated geography-specific minimum-volume/unit area needed to obtain blanket coverage (537). In this regard, it will be noted that droplet spreading characteristics can vary dependent on many factors, including substrate surface chemistry, substrate surface energy and various factors contributing to these things; this dependence leads to a result that for some fab processes, the same ink might spread differently in a first portion of a substrate than in a second portion of the same substrate, and thus create undesired thickness variation (e.g., in situations where the process is being used to deposit a large scale film, such as an encapsulation layer). In association with the optional technique represented by numerals 535 and 537, this variation is specifically measured during calibration or in advance, relative to test panels, and is then programed into the system in a manner where parameters vary depending on portion of the substrate being printed on. For example, a baseline volume/area links the ink with a specific "minimum" layer thickness (i.e., associated with blanket coverage), but this can vary in some embodiments depending on region of the substrate. Perhaps otherwise stated, in areas where ink spreads more, a different (e.g., greater) volume/area or droplet density can be used, and so forth. Note that other embodiments can simply use one set of parameters per panel or substrate; for example, if a layer is to be fabricated in respective "pixel wells" on a substrate, it may be desired to treat each pixel well that will receive the layer in exactly the same manner; even for embodiments where a relatively large layer is being deposited (e.g., encapsulation, smoothing or barrier layer), it can be desirable for many applications to model deposition parameters as being consistent throughout the substrate, with parameters calibrated and stored in advance for application in an assembly line process. Should parameters be specific to substrate area, however, these considerations can optionally be taken into account when determining which of multiple alternative droplet sizes should be selected (e.g., as an additional test or requirement beyond criteria 523, 525 and 527). Per numeral 539, whichever of the mentioned tests are used to dictate print process particulars, printing is planned based on these parameters and the result is a finished electronic device with improved layer homogeneity, fabricated using a faster print time than would otherwise be the case.

Figure 5B:
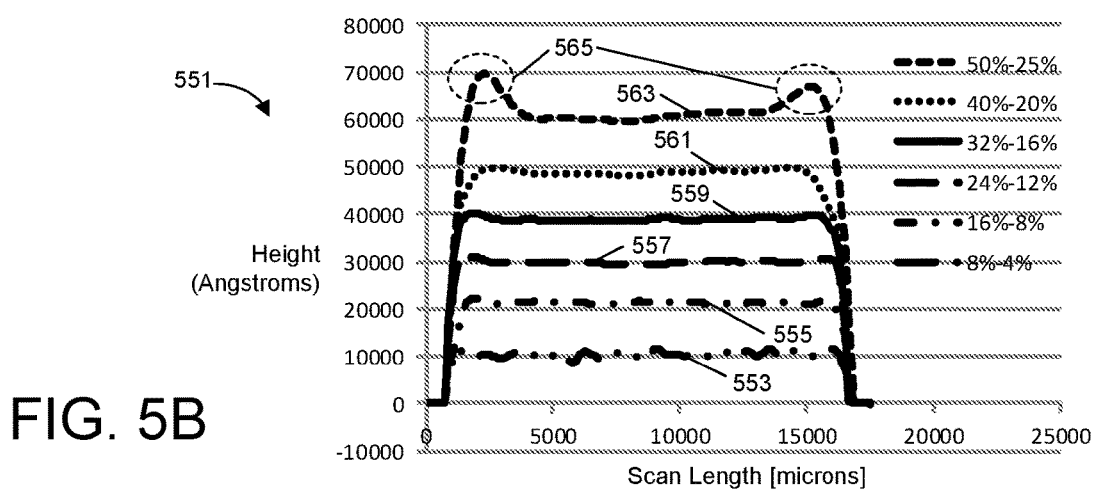
FIG. 5B is a plot of layer thickness as a function of volume of ink per unit area of substrate (e.g., "ink fill density").

FIG. 5B provides a graph 551 used to explain various issues associated with scaling depth of a layer during the process of depositing liquid ink. FIG. 5B shows thickness profiles of fabricated films obtained with a stylus profilometer, useful in connection with the calibration process and scaling a baseline ink volume per unit area or droplet density as discussed above. Following the production of actual test layers of material, or simulation of those layers, including ink droplet spreading characteristics, an ink volume can be correlated with different steps in layer thickness. For example, a first curve 553, representing a 1.0 micron thick layer, is associated with an ink volume per unit area (relative to print grid maximum droplet population) corresponding to 8% of maximum per-scan ink volume per unit area, assuming droplet firing at all print grid nodes). Note that the film is continuous, i.e., there are no gaps in the center of the layer represented by curve 853, which is seen to have substantially uniform thickness. For a subsequent fabrication process, if a layer thickness of 1.0 micron was assigned by received layout data for the deposited layer, this quantity of 1.0 micron would be used along with the baseline volume/area associated with the ink (i.e., dependent on its spreading characteristics) to select a droplet pattern (e.g., "halftone" pattern) that would distribute droplets to various print grid points in order to achieve a uniform deposited layer (following droplet spreading). Similarly, a second curve 855 is seen to represent a uniform 2.0 micron thick layer, corresponding to 16% print grid fill. Based on baseline volume/area, e.g., of 8%, a 16% ink volume for a particular substrate region might be generated to produce a 2.0 micron thick layer. Mappings between layer thickness values and droplet pattern ("halftone") selection can also be extrapolated using this process; as an example, if layout data called for a 1.5 micron thick encapsulation layer, scaling selected to correspond to a point roughly between these two values (12%) could be applied (e.g., halfway between 8% and 16%). Other illustrated curves 857, 859, 861 and 863, respectively corresponding to 3.0, 4.0, 5.0 and 6.0 micron-thick layers are associated with fills of 24%, 32%, 40% and 50%, respectively. By specifically matching different "scaled" volume/area or droplet densities to respective layer thicknesses, and associating a scaled volume to deliver quantity of ink to a target region, a designer can customize ink deposition to any desired thickness in a manner that will lead to predictable results; this provides a high degree of control over thickness of material deposited via liquid ink. As these examples imply, multiple ink volumes/area (which provide complete coverage) can be measured and used to interpolate fills for a desired thickness, such as for the 1.5 micron thickness example provided above.

In many applications, it is also desirable to provide a crisp, straight edge at border regions. For example, as represented in FIG. 5B by numerals 565, if ink density is maintained on a consistent basis up to exactly layer periphery, the surface tension of the ink can cause the liquid ink to form "horns" or "bat ears" which can be subsequently hardened to form an undesired thickness variation in the finished layer. Techniques are discussed below for varying ink density at border regions in order to mitigate this effect and related effects, e.g., by adjusting the volume/area or droplet pattern (or related parameters, such as droplet size) at portions of a layer which are adjacent to the edge of a layer. These techniques will be revisited later in this discussion.

Figure 6A:
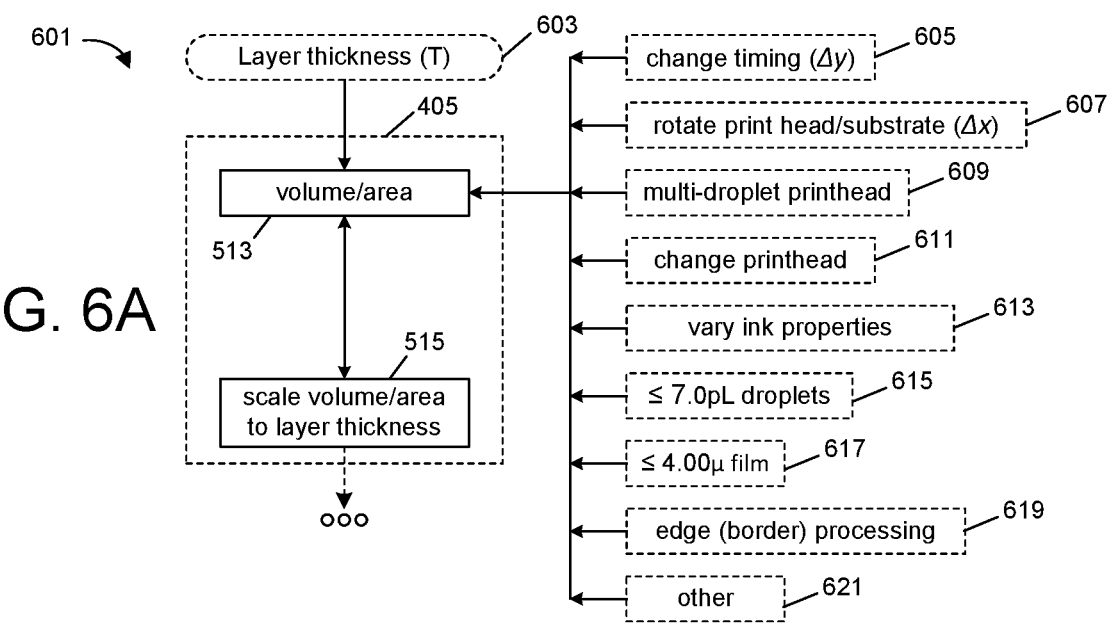
FIG. 6A shows some alternative techniques for print process planning/adjustment to manufacture thin films with improved homogeneity and print speed.

FIG. 6A illustrates still further optional techniques that can be employed to provide for greater layer homogeneity and print speed. These further techniques are generally referenced by numeral 601. As before, a value for layer thickness for at least one target region is first retrieved (603). Such retrieval can be from machine-accessible digital memory, for example, responsive to an operator input or preprogramming associated with a digital (e.g., computer-controlled) assembly line-style fab process. A system, e.g., in the form of one or more processors, defines layer parameters as before, once again utilizing techniques to improve layer homogeneity and print speed (i.e., via process 405). For example, as before, the system calculates a minimum volume/area (413) for a given ink/substrate process configuration (i.e., where the minimum area density provides for "blanket" ink coverage), and it then scales (415) this quantity (i.e., according to the ratio of the desired layer thickness to the thickness produced through use of the minimum) in order to produce the desired layer. The right side of FIG. 6A illustrates a number of optional techniques to improve layer homogeneity and print speed that can be used in addition to or in lieu of those techniques already discussed (e.g., in any desired combination or permutation as pertinent to the particular implementation). As indicated by numeral 605, a first such technique involves changing the in-scan pitch or separation between horizontal axes of a print grid (see the reference to numeral 307 provided above in connection with FIG. 3A); see also the circuitry and associated discussion provided in U.S. Pat. No. 9,010,899, FIGS. 14A-B, and in aforementioned US Patent Publication 20150373305 (U.S. Ser. No. 14/840,343), FIG. 5D, which has been incorporated by reference, particularly in the context with discussion of clocks and triggers. By changing the frequency of the clock (or trigger signal) used to time the firing of a given waveform, one can effectively change the droplet density and melding properties of a given droplet size and/or print head, and thereby change the extent to which a given droplet size and/or print head is amenable to producing a homogenous film within specified print times. In one embodiment, these techniques are applied in association with the filter and filter/pattern adjustment techniques discussed above (see the discussion of FIG. 4A) via a trigger-speed definition for each scan in order to interleave droplets to provide for melding of droplets that mitigates undesired wicking and better positions droplets for homogeneous layer fabrication. That is to say, in one embodiment, a first print grid spacing can be used for a first scan and a second, different spacing (along vertical or horizontal print grid axes, or both) can be used for a second scan; each scan can deposit similar droplet sizes (and landing positions) from a common set of nozzles, or respective droplet sizes (or positions) from respective sets of nozzles. To cite another example, by further combining these techniques with variable-step print head positioning (see, e.g., numerals 416 and 417 of FIG. 4A and supporting discussion), the combination of these various techniques can precisely position droplets of specific expected volume and trajectory to provide precisely calculated volume density distribution over a given unit area by carefully distributing both size and relative position of droplets from different nozzles or nozzle-waveform combinations. Numeral 607 indicates another optional variant where the cross-scan print grid pitch is further adjusted, e.g., by rotating the print head. That is, as noted earlier, in one embodiment, the printer advantageously can include a rotational mechanism (i.e., power drive of some sort) to rotate the print head and thereby effectively vary cross-scan pitch according to the sine or cosine of the relative angle between the print head and the cross-scan axis (e.g., numeral 307 in FIG. 3A). Such a technique varies the separation between vertical axes (306) from FIG. 3A, and can be optionally used with or in lieu of the timing (Δy) variation discussed just above. Numerals 609 and 611 relate to options where the effective droplet size is varied by, for example, using a print head adapted to use multiple drive waveforms to produce droplet sizes with specifically-sought expected volume properties (and variance between expected volume properties), or by changing from one print head (e.g., one that produces droplets having an average volume of 10.0 pL per nozzle, or some other value) to another (e.g., one that produces droplets having an average volume of 7.0 pL per nozzle). In one embodiment, the print head can be selected to be one that effectively deposits multiple like-size droplets at the same time (e.g., two droplets using a double-drive pulse, for example), or where fixed multiple droplet sizes (e.g., 1×, 2×, 3×, 4×) are fixed, rather than being programmable and customizable. Per numeral 613, it is also possible to vary the ink that is used to effectuate a particular deposition. For example, if it is determined that the specified layer thickness (T) is too large relative to a given droplet size (e.g., the droplets for the given printer and print process do not sufficiently spread upon contact, such as illustrated relative to FIGS. 2B and 2C), it is possible to select a different ink, or to vary composition of the ink (including without limitation introducing a spreading agent) or to modify the substrate to possess a different surface energy. In yet another embodiment, a print head and/or print process is used which produces ink droplets having an expected volume of less than or equal to 7.0 pL on average (615) or that produces a film thickness that is less than 4.00 microns (617). In yet another embodiment, the ink density, halftone pattern, or other ink or process parameters are applied as a form of edge or border processing 619, to produce a crisp edge; these techniques, also discussed in the aforementioned U.S. Pat. No. 8,995,022 (which has been incorporated by reference) provide powerful techniques for producing a layer of consistent thickness right up to the intended periphery of the desired layer, with customized or tailored tapering. Finally, as referenced by numeral 621, other techniques can also be used to vary or adjust the droplet density and/or ink volume to be applied to a given unit area and/or the way in which deposited droplets meld together, to inhibit droplet wicking, provide for smooth layer formation with improved print time, and otherwise produce a very thin film layer, notwithstanding that the droplets themselves might have greater inherent diameter than the intended film thickness.

Figure 6B:
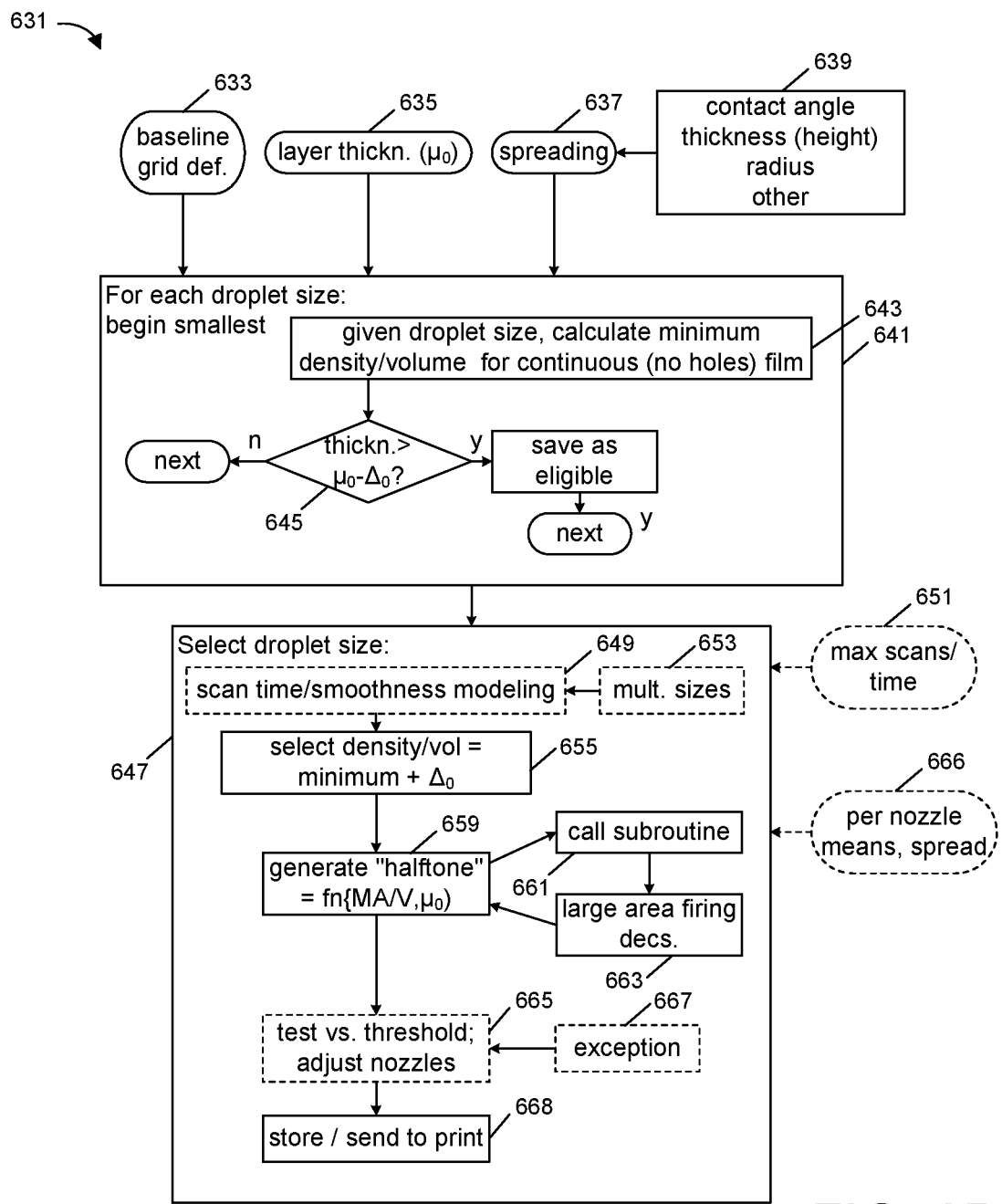
FIG. 6B also shows some alternative techniques for print process planning/adjustment to manufacture thin films with improved homogeneity and print speed; optionally, per numeral 665, per-nozzle deposition can be adjusted by varying (programming) the waveform used to drive any individual nozzle.

FIG. 6B is used to discuss an embodiment (631) where droplet sizes are effectively varied between multiple, discrete alternatives. As discussed above, this type of variation, if supported by the characteristics of the particular machine (system) implementation, can in one embodiment tailor ink volume/area and droplet melding so as to achieve the layer homogeneity and/or optimize in-specification printing time and other improvements referenced above. To cite a first example, if it is determined that specification for a particular assembly line-style process calls for an organic encapsulation layer of 1.0 microns±10%, and if a particular machine produces droplets having a diameter of 30 microns (which do not sufficiently spread, and thus produce a layer that is too thick, see, e.g., the discussion provided above in connection with FIGS. 2B and 2C), then in one embodiment, the print head is changed to one that produces smaller droplet diameters (e.g., 12 microns), or the nozzle-drive waveform for each nozzle is changed and/or programmed to support the firing of smaller droplet sizes. Note that these techniques can also be used to reduce and/or vary other types of nozzle error (e.g., error in per-nozzle trajectory, volume or velocity, as introduced above in connection with FIGS. 3E and 4B and supporting discussion). A print head can be selected that provides for discrete droplet sizes that have been predefined in advance or otherwise programmed into the print head drive circuitry in order to provide droplet properties that can be selected or varied in situ, if desired. Thus, if a given droplet size does not work to meet required layer characteristics (e.g., does not produce a layer such as exemplified by the discussion relative to FIG. 2D, above), then in one embodiment, droplet properties are changed until such a layer can be obtained. If multiple droplet sizes are available that "all work," then the techniques identified above can be used to arbitrate between these acceptable alternatives according to any desired criteria, for example, selecting the process with the largest size of discrete droplet sizes or the smallest print grid (e.g., to minimize printing time), or that produce the smoothest layer (e.g., potentially the smallest size of discrete droplet sizes). In a variation, multiple sizes can be used together (e.g., a first scan with small droplets deposited in a dispersed pattern, followed by larger droplets for interleaving, or vice-versa). Note that such a technique does not imply that multiple droplet sizes cannot be used in one or multiple scans (e.g., droplet sizes can be combined in any desired permutation, for example, as part of a variable droplet volume halftone, or edge profile management technique).

As indicated in FIG. 6B, the depicted process assumes a baseline print grid definition (633), specification-defined layer thickness (635), ink spreading characteristics (637) and associated ink definition information (including in this embodiment "contact angle," droplet thickness or height, radius, or other properties, per numeral 639). The method then proceeds to evaluate each alternative droplet size per numeral 641. [Note that "contact angle" means the angle made between a droplet at its periphery and the substrate, e.g., average contact angle for a spherical droplet can be modeled as a flattened section of a sphere, at the section's periphery—see numerals 298 and 299 in FIGS. 2A and 2B, respectively.] Naturally, per the discussion above, depending on embodiment, each of these ink/droplet and/or print process parameters can be varied but, for purposes of the instant discussion, it should be assumed that multiple droplet sizes (however produced) are to be individually evaluated for the purpose of selecting one of the multiple droplet sizes for use in the print process, to enhance layer homogeneity and/or print time, all within specification constraints for layer fabrication; to evaluate a given droplet size, the parameters represented by numerals 633, 635, 637 and 639 are assumed for the time being as fixed, in order to evaluate whether the given print process size is suitable for use in the given print process and whether a different one of the alternative (multiple) droplet sizes should be selected.

Thus, as represented by a block 641, these parameters are assumed as fixed and each possible discrete droplet size is evaluated. The method in iterations takes each discrete droplet size beginning with the smallest, to determine whether that droplet size is amenable to producing the layer of the desired thickness (635). For each droplet size evaluated, the method calculates the minimum volume/area (643) for the droplet size in question given the print grid definition (633) and spreading characteristics (637) which will produce "blanket" coverage of the ink, that is, for a continuous film that does not have gaps/voids. The first consideration is whether the droplets, given spreading, produce a layer that is too thick (see, e.g., FIG. 2B and supporting discussion), i.e., the thickness following layer processing/cure is greater than desired ($\mu_0$-$\Delta_0$), e.g., where $\mu_0$ represents the specified maximum for layer thickness and $\Delta_0$ represents a desired buffer, as introduced earlier. If the droplet size cannot produce a layer that is "thin enough," per numeral 645, that droplet size is in this embodiment deemed ineligible for use, as represented by the "next" reference in FIG. 6B. In other embodiments, instead of discarding the droplet size, other techniques are evaluated or used to determine whether the given droplet size can be used at all, e.g., whether print grid adjustment, ink property modification, and so forth, can be varied so that the given droplet size can still be used to produce a layer that is "thin enough." If the given droplet size is suitable, the method then saves the droplet size as potentially usable, and similarly proceeds to evaluate the next droplet size.

Once all alternative discrete droplet sizes have been evaluated in this manner, and a set of alternatives have been established, the method then proceeds to select (647) one of these alternatives for use in the fab process, applying others of the considerations discussed earlier. For example, per function block 649, the method can then determine, given the maximum droplet density (e.g., assuming a fully-populated print grid relative to a target region, that is, where all possible print grid nodes represented droplet firings), whether a scan time constraint would be violated if the particular alternative were used; if such a constraint would be violated, then the particular droplet might be eliminated from use (assuming other alternatives were still available). Again, in other embodiments, instead of discarding the droplet size (or if no other alternatives were available), other techniques can be evaluated to determine whether the droplet size could be used at all, e.g., whether print grid adjustment, ink property modification, and so forth, if varied, could produce an acceptable fab process that met specification without violating the constraint. In one embodiment, per numeral 651, these criteria can be expressed as a maximum number of scans and/or a maximum time. Also as represented by numeral 649, the method can use smoothness criteria to evaluate differently sized droplets, e.g., the system obtains a measure of layer smoothness (e.g., RMS, as measured and input by an operator or measured automatically on a test substrate), and picks among the remaining droplet candidates according to which produces the smoothest layer with the minimum number of scans. In one contemplated implementation, a range of nozzle droplet sizes (and associated drive signals) are provided for in advance, enough so that for any given layer thickness (e.g., 0-30 microns) multiple droplet sizes (653) will be suitable for use following the evaluation procedures introduced above, with the smoothness/timing constraints used to arbitrate between these "acceptable candidates." In such an embodiment, the system can access a single file from memory (e.g., the file indexing all measured characteristics such as thickness, surface roughness, contact angle and so forth according to droplet size, if desired, on a basis that varies with substrate Cartesian coordinate, for the print process in question) and can perform automated processing, according to software, to select the droplet size that will be used. In a system where the print head is changed to vary droplet size, the software can engage a different print head (e.g., on the same or a different traveler) or can alert an operator that he/she needs to manually change the print head. Other alternatives are also possible. Many other criteria can also be used to select between droplet alternatives, either in addition to or in place of those criteria set discussed above.

As indicated by the remainder of the FIG., the depicted method selects one of the alternative droplet sizes for use in the print process, and it then calculates nozzle firing data as has been discussed above. For example, for the selected droplet size, the method selects a baseline volume/area or droplet density (655) to be the minimum (for the particular droplet size) to obtain "complete" ink coverage of the intended target region. A droplet distribution or density can then be determined according to a formula predicated on ink spreading characteristics and print grid in-scan and cross-scan pitch dimensions. Note once again that in the FIG., the value $\Delta_0$ represents an optional buffer and the value Ho represents the baseline volume/area or droplet density (and corresponding baseline thickness). Per numeral 659, the baseline is then scaled as necessary to obtain proper layer thickness, via a droplet pattern which distributes droplets in a manner that produces an even layer of the desired thickness ink following droplet melding and conversion of the layer to a permanent structure, that is, without voids/gaps, and with height variation minimized. As indicated by numeral 661, in one embodiment, this function is established by calling a subroutine and passing, droplet size, print grid pitch and droplet spreading parameters to that subroutine, which then returns a large area firing map (663) with droplet firings distributed, both within each individual scan (e.g., to control wicking) as well as across scans, in a manner to enhance proper melding, per the techniques discussed above. A second subroutine can then be called (665) to, dependent on digital memory contents representing per-nozzle volume and/or landing position means and spreads (666), test the firing map to ensure ink density homogeneity in order to detect aberrations on a unit area basis; should localized ink volumes vary (e.g., within any target region) by more than a predetermined threshold error amount, or should a processor-applied modeling algorithm predict that undesired wicking or thickness defects will occur beyond a threshold error amount (i.e., dependent on the expected means and spread values for the various nozzles used to print), then an exception process (667) can be triggered and used to develop corrected firing decisions. For example, if it is determined that a particular column of droplets will be off-center, as determined from expected per-nozzle stored data, then a different drive-waveform can be tested, or a different nozzle substituted for a first nozzle's use (e.g., in a subsequent scan), or the same nozzle can be used (but with a positional offset or "step" of the print head), and so forth. Many variations using the various capabilities adduced in this disclosure can be applied by those having ordinary skill in the art without departing from the spirit of the techniques discussed herein. Once the firing data set forth by the firing map has been adjusted/corrected, as appropriate, the firing map is stored and/or sent to print, as indicated by process box 668.

Figure 6C:
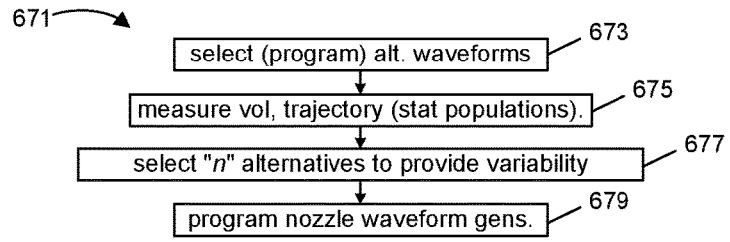
FIG. 6C is a flow diagram relating to one embodiment where multiple, alternate, nozzle drive waveforms are programmed into circuitry associated with a given nozzle.

FIG. 6C is a block diagram of a method 671 of defining multiple waveforms for any given print nozzle. Note that (as described in the aforementioned patents and patent publications which have been incorporated by reference), in one embodiment, each nozzle has a specifically shaped waveform which is defined or selected in advance with associated assumptions regarding droplet volume and landing position. See, for example and without limitation, the discussion regarding US Patent Publication No. 20150099059 (e.g., FIGS. 15A-D), similar discuss in U.S. Pat. No. 9,010,899 regarding FIGS. 14A-C, and the discussion regarding FIG. 5D in US Patent Publication No. 20150298153, which are incorporated by reference. Each of these references describes mechanism for providing waveforms to print head nozzles on an individualized basis, e.g., for a print head having thousands of nozzles. Per numerals 673 and 675, the method selects for each nozzle a specific waveform and then measures volume, landing position (e.g., trajectory) and other per-nozzle-waveform combination parameters, compiling a statistical population of many independent measurements in order to develop statistical confidence for mean and spread parameters. Based on this information, the method can then select (677) a set of "n" waveforms for each nozzle which can be expected to produce a respective droplet volume and respective landing position. While any criteria desired can be used for identifying this set, in one embodiment, the waveforms are selected to provide for evenly distributed values across a range of droplet volumes and respective landing positions (e.g., within a range of ±10% of an expected value). For example, if two waveforms produce nearly ideal (but nearly identical) expected volumes and landing positions, the method might discard one of these and instead opt for a second waveform that produced 110% of volume and/or a droplet, or that represents deliberate expected positional offset from the desired landing location, i.e., to provide for variability. This then provides for a greater effective set of options for mixing and matching droplets (from the same or different nozzles) for any given intended deposition area, e.g., combining a 9.90 pL expected droplet volume from a first nozzle/waveform with a 10.10 pL expected droplet volume from a second nozzle/waveform to obtain an expected aggregate volume of 20.00 pL; see, e.g., U.S. Pat. Nos. 9,010,899 and 9,352,561, referenced earlier. Finally, with a set of values selected, the method then programs (679) the drive circuitry for individual nozzles with the corresponding waveform, such that the programmed waveform will be used to drive the corresponding nozzle at the appropriate "trigger time." As noted in the patents and patent publications which have been incorporated by reference, in one embodiment, up to sixteen different waveforms can be selected for each nozzle and programmed in advance, with selection of a particular one of these alternatives being effected by a waveform selection value, "written to" the digital circuitry for the particular nozzle. This is not required for all embodiments.

Figure 6D:
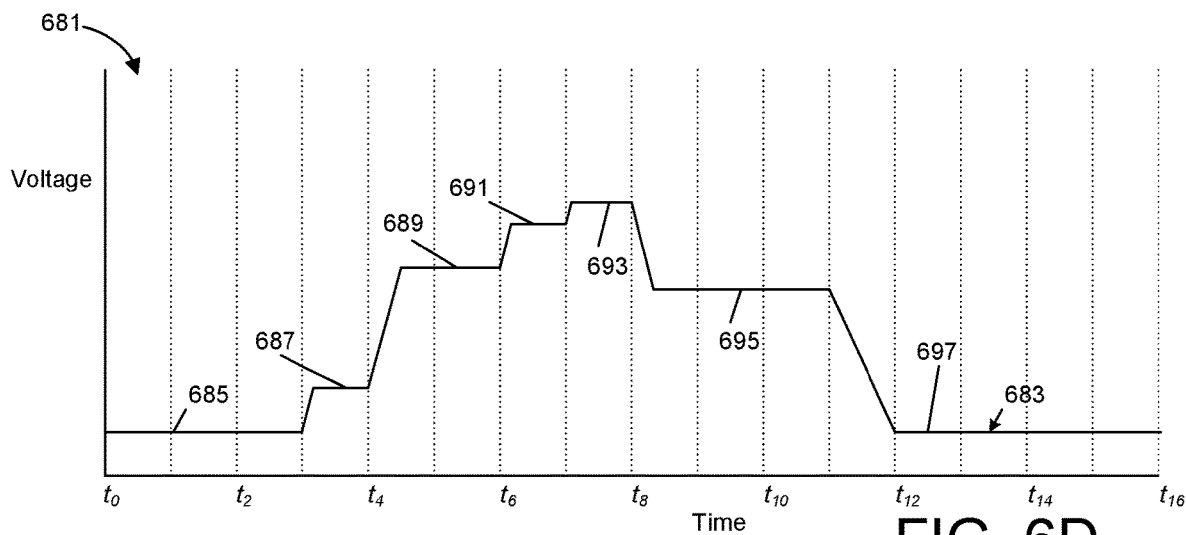
FIG. 6D shows a hypothetical nozzle drive waveform in an embodiment where nozzle drive waveforms (and associated droplet size, velocity, trajectory, etc.) can be customized.

FIG. 6D illustrates how "customized" waveforms can be predefined as a sequence of discrete signal levels, e.g., defined by digital data, with a drive waveform being generated by a digital-to-analog converter (DAC) for a given nozzle. Numeral 681 in FIG. 6D identifies a graph of a waveform 683 having discrete signal levels, 685, 687, 689, 691, 693, 695 and 697. In one embodiment, each nozzle driver can include circuitry that receives multiple waveforms (e.g., up to sixteen or another number), with each waveform being defined as a series of signal levels of variable voltage and duration. Each signal level in the series can be individually expressed as a multi-bit voltage and a multi-bit duration. That is to say, in such an embodiment, pulse width can effectively be varied by defining different durations for one or more signal levels, and drive voltage can be waveform-shaped in a manner chosen to provide subtle droplet size, velocity or trajectory (landing position) variation, e.g., with droplet volumes gauged to provide specific volume gradations such as in units of 0.01 pL. Waveform shaping in this manner provides ability to tailor droplet volumes and flight parameters to be closer to ideal values. These waveform shaping techniques also facilitate a strategy for reducing or eliminating visible defects; for example, in one optional embodiment, a single assigned nozzle drive waveform is tailored in advance for each nozzle, such that all nozzles provide uniform droplet volume (e.g., as near as possible to 10.00 pL). As mentioned, alternative predetermined waveforms are optionally made available to each nozzle, with dynamic calibration (or another process) used to select (e.g., program) "the one" of the alternative predetermined waveforms that is to be applied in the short term. Other possibilities also exist.

The effects of different drive waveforms and resultant droplet volumes can be measured in advance. In one embodiment, for each nozzle, up to sixteen different drive waveforms can be stored in a nozzle-specific, dedicated, 1 k static random access memory (SRAM) for later, elective use in providing discrete volume variations, as selected by software (see the incorporated-by reference applications, publications and patents referenced earlier). With the different drive waveforms on hand, each nozzle is then instructed droplet-by-droplet as to which waveform to apply via the programming of data that effectuates the specific drive waveform.

Note that in an alternate embodiment, drive waveforms can be fixed, with one of several discrete waveforms being applied to each nozzle as described above. For example, as noted earlier, one embodiment uses a print head where fixed droplet volumes can be multiples of one another, e.g., print head is used which can feature multiple droplet sizes (e.g., 1×, 2×, 3×, 4×, etc.), with a different waveform or programmed value used to discriminate each selection. Thus, in such a system, a range of droplet sizes can be selected for each nozzle, e.g., 1.0 pL, 2.0 pL, 4.0 pL and so forth, on demand; note that there is no per se requirement that droplet volumes be related as integer multiples and in another embodiment, the volumes can be arbitrary. In yet another contemplated embodiment, a single waveform is applied to all nozzles for a given pass (scan), but this waveform can be scaled in between scans and by such action, effectively vary (e.g., scale) droplet particulars for a group of nozzles at once (e.g., the waveform can be reset for a group of nozzles per scan). Once again, whichever technique is used, control software advantageously retrieves per-droplet (per-nozzle, per-waveform statistics) and uses these to plan droplet combination and distribution to place individual droplets relative to one another in a manner that produces better layer homogeneity with a high degree of predictability.

Figure 7A:
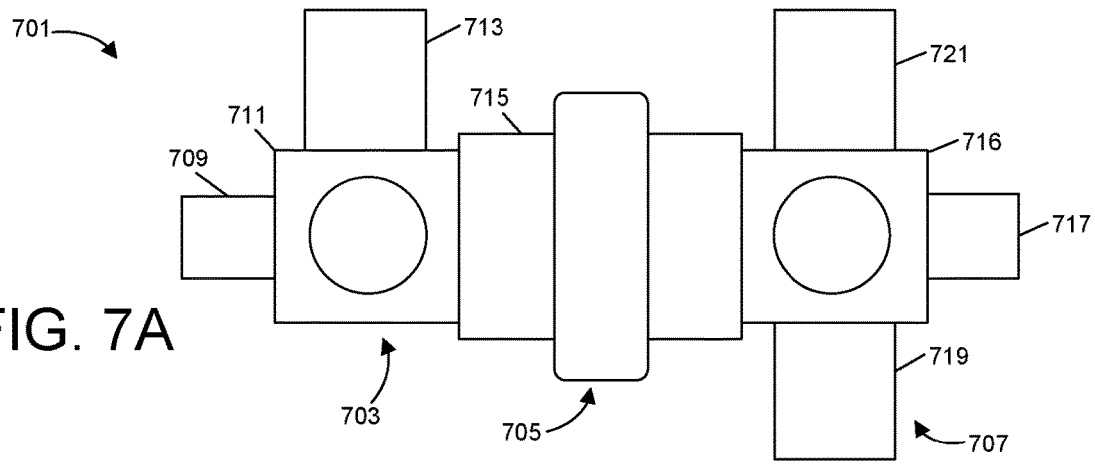
FIG. 7A shows one embodiment of a fabrication apparatus for flat panel electronic devices; the apparatus includes multiple modules (e.g., 703, 705 and 707), one of which includes a printer.

FIG. 7A shows one contemplated multi-chambered fabrication apparatus 701 that can be used to apply techniques disclosed herein. Generally speaking, the depicted apparatus 701 includes several general modules or subsystems including a transfer module 703, a printing module 705 and a processing module 707. Each module maintains atmospheric environment, controlled so as to be different than ambient air and to exclude unwanted particular or oxygen or moisture; printing for example can be performed by the printing module 705 in a first controlled atmosphere and other processing, for example, another deposition process such an inorganic encapsulation layer deposition or a curing process (e.g., for printed materials), can be performed in a second controlled atmosphere (note that these atmospheres can optionally be the same, optionally, a nitrogen or other inert gas atmosphere). The apparatus 701 uses one or more mechanical handlers to move a substrate between modules without exposing the substrate to an uncontrolled atmosphere. Within any given module, it is possible to use other substrate handling systems and/or specific devices and control systems adapted to the processing to be performed for that module.

Various embodiments of the transfer module 703 can include an input loadlock 709 (i.e., a chamber that provides buffering between different environments while maintaining a controlled atmosphere), a transfer chamber 711 (also having a handler for transporting a substrate), and an atmospheric buffer chamber 713. Within the printing module 705, it is possible to use other substrate handling mechanisms such as a flotation table for stable support of a substrate during a printing process. Additionally, a xyz-motion system, such as a split axis or gantry motion system, can be used for precise positioning of at least one print head relative to the substrate, as well as providing a y-axis conveyance system for the transport of the substrate through the printing module 705. It is also possible within the printing chamber to use multiple inks for printing, e.g., using respective print head assemblies such that, for example, two different types of deposition processes can be performed within the printing module in a controlled atmosphere. The printing module 705 can comprise a gas enclosure 715 housing an inkjet printing system, with means for introducing an inert atmosphere (e.g., nitrogen) and otherwise controlling the atmosphere for environmental regulation (e.g., temperature and pressure), gas constituency and particulate presence.

Various embodiments of a processing module 707 can include, for example, a transfer chamber 716; this transfer chamber also has a including a handler for transporting a substrate. In addition, the processing module can also include an output loadlock 717, a nitrogen stack buffer 719, and a curing chamber 721. In some applications, the curing chamber can be used to cure, bake or dry a monomer film into a uniform polymer film; for example, two specifically contemplated processes include a heating/baking process and a UV radiation cure process.

In one application, the apparatus 701 is adapted for bulk production of liquid crystal display screens or OLED display screens, for example, the fabrication of an array of (e.g.) eight screens at once on a single large substrate. These screens can be used for televisions and as display screens for other forms of electronic devices. In a second application, the apparatus can be used for bulk production of solar panels in much the same manner. In yet another embodiment, the apparatus can be used for the production of other types of light emitting devices, or other electronic products.

The printing module 705 can advantageously be used in such applications to deposit organic light generating layers or encapsulation layers that help protect the sensitive elements of OLED display devices. For example, the depicted apparatus 701 can be loaded with a substrate and can be controlled to move the substrate back and forth between the various chambers in a manner uninterrupted by exposure to an uncontrolled atmosphere during the encapsulation process. The substrate can be loaded via the input loadlock 709.

A handler positioned in the transfer module 703 can move the substrate from the input loadlock 709 to the printing module 705 and, following completion of a printing process, can move the substrate to the processing module 707 for cure. By repeated deposition of subsequent layers, each of controlled thickness, aggregate encapsulation can be built up to suit any desired application. Note once again that the techniques described above are not limited to encapsulation processes, and also that many different types of tools can be used. For example, the configuration of the apparatus 701 can be varied to place the various modules 703, 705 and 707 in different juxtaposition; also, additional, fewer or different modules can also be used. Such an embodiment is well suited for assembly line style manufacturing where, because many nozzles are present, a precessing range of nozzles/nozzle-waveform calibrations can be remeasured at intervals while a prior substrate is being removed from a print chamber and a new substrate is being introduced (or otherwise intermittently during run-time).

While FIG. 7A provides one example of a set of linked chambers or fabrication components, clearly many other possibilities exist. The techniques introduced above can be used with the device depicted in FIG. 7A, or indeed, to control a fabrication process performed by any other type of deposition equipment.

Figure 7B:
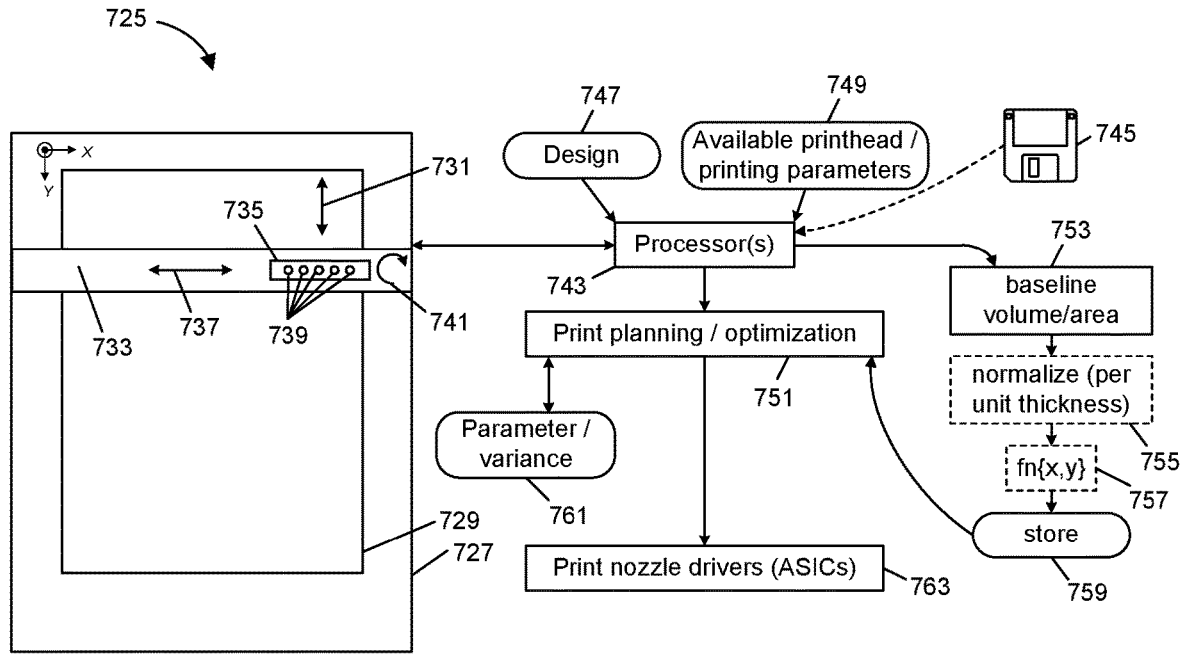
FIG. 7B is an illustrative diagram relating to control of the printer used in the apparatus of FIG. 7A.

FIG. 7B is an illustrative view that depicts several functional components within the printer (e.g., within a print module) and depicts a plan view of the substrate as it might appear during the deposition process. The print chamber is generally designated by reference numeral 725, the substrate to be printed upon is generally designated by numeral 729, and a support table used to transport the substrate is generally designated by numeral 727. Generally speaking, any xy coordinate of the substrate is reached by a combination of movements, including y-dimensional movement (and optionally x-dimensional movement) of the substrate by the support table (e.g., using flotation support) and using "slow axis" x-dimensional movement of one or more print heads 735 along a traveler 733, as generally represented by arrows 737. The flotation table and substrate handling infrastructure are used to move the substrate and advantageously provide deskew control along one or more "fast axes" (731), as necessary. The print head is seen to have plural nozzles 739, each of which is separately controlled by a firing pattern derived from a firing map (e.g., to effectuate printing of columns corresponding to printer grid points). With relative motion between the one or more print heads and the substrate provided in the direction of the fast axis (i.e., the y-axis), printing describes a swath that typically follows individual rows printer grid points. The print head can also advantageously be adjusted to vary effective nozzle spacing (e.g., by rotating of the one or more print heads, per numeral 741). Note that multiple such print heads can be used together, oriented with x-dimension, y-dimension, and/or z-dimensional offset relative to one another as desired (see the axis legend in the upper left-hand corner of FIG. 7B). The printing operation continues until the entire target region (and any border region) has been printed with ink, as desired. Following deposition of the necessary amount of ink, the substrate is finished, either by evaporating solvent to dry ink (e.g., using a thermal process), or by use of a cure process, such as a UV cure process.

The right-hand side of FIG. 7B depicts the interaction of control systems (e.g., comprising one or more processors 743 driven under the auspices of control software 745) in defining suitable print process parameters and applying those parameters to control printing. More specifically, the control software causes the system to receive a base layer design which defines geographies (on the substrate) where a desired layer is to be printed (e.g., in terms of Cartesian maps defining pixel wells or a substrate area that is to receive liquid ink, per numeral 747, as well as the desired thickness for the layer in-question). The software stores or retrieves this information from memory, and it then causes the system to receive process parameters (749), for example, nozzle cross-scan pitch, nozzle positions, number of nozzles, and other information relating to the print head and expected spreading characteristics of the ink. This various data is then applied in a print planning and/or print optimization step (751) where planning utilizes the techniques referenced earlier for improving layer homogeneity and/or print speed. For example, as noted above, the software causes the system to calculate a baseline volume/area (753), equate this to a per-unit thickness (755) and then scale this thickness as a function of Cartesian location on the substrate (757) in order to develop a firing map. As noted earlier, this firing map can be made dependent on measured, per-nozzle or per-nozzle-waveform combination means and spread measures, and can optionally be filtered so as to provide for multiple maps that correspond to scans which deposit interleaved droplets. Once such processing has been performed, information representing the nozzle firing particulars is then stored into digital memory and subsequently passed to a printer for use in the fab process. As indicated by numeral 761, in one embodiment, the software causes the control system to select or vary one or more process parameters (such as droplet size, print grid definition, and so forth) using the techniques discussed earlier, with any variations instantiated in the stored print data (759). During run-time, the nozzle drivers are then driven responsive to the stored print data, as optimized. These drivers are indicated by FIG. 7B to be implemented in the form of application-specific integrated circuits, e.g., each driving a number of nozzles such as 256 nozzles in order to control printing in response to the associated firing instructions. Printing thus results in a layer of liquid ink on the substrate, which is subsequently advanced to a processing module to cure the liquid ink or otherwise convert it to a permanent form.

Figure 7D:
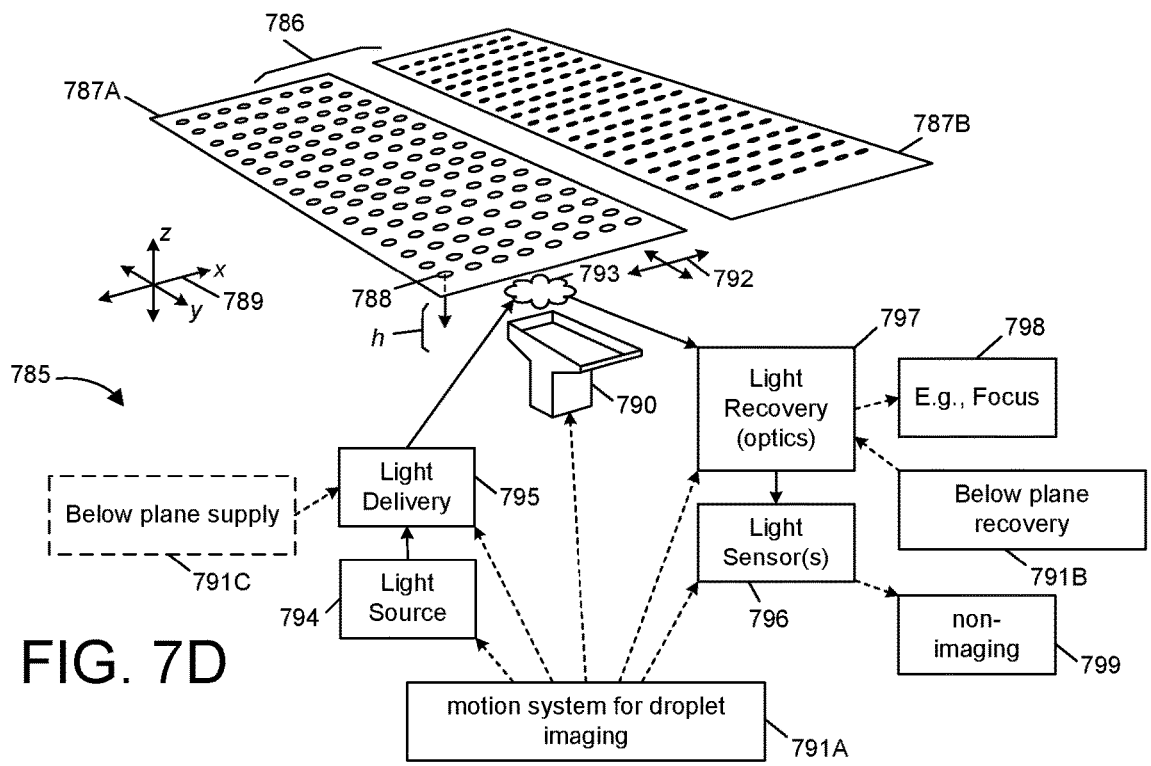
FIG. 7D is an illustrative view showing integration of a droplet measurement device with a printer.
Figure 7C:
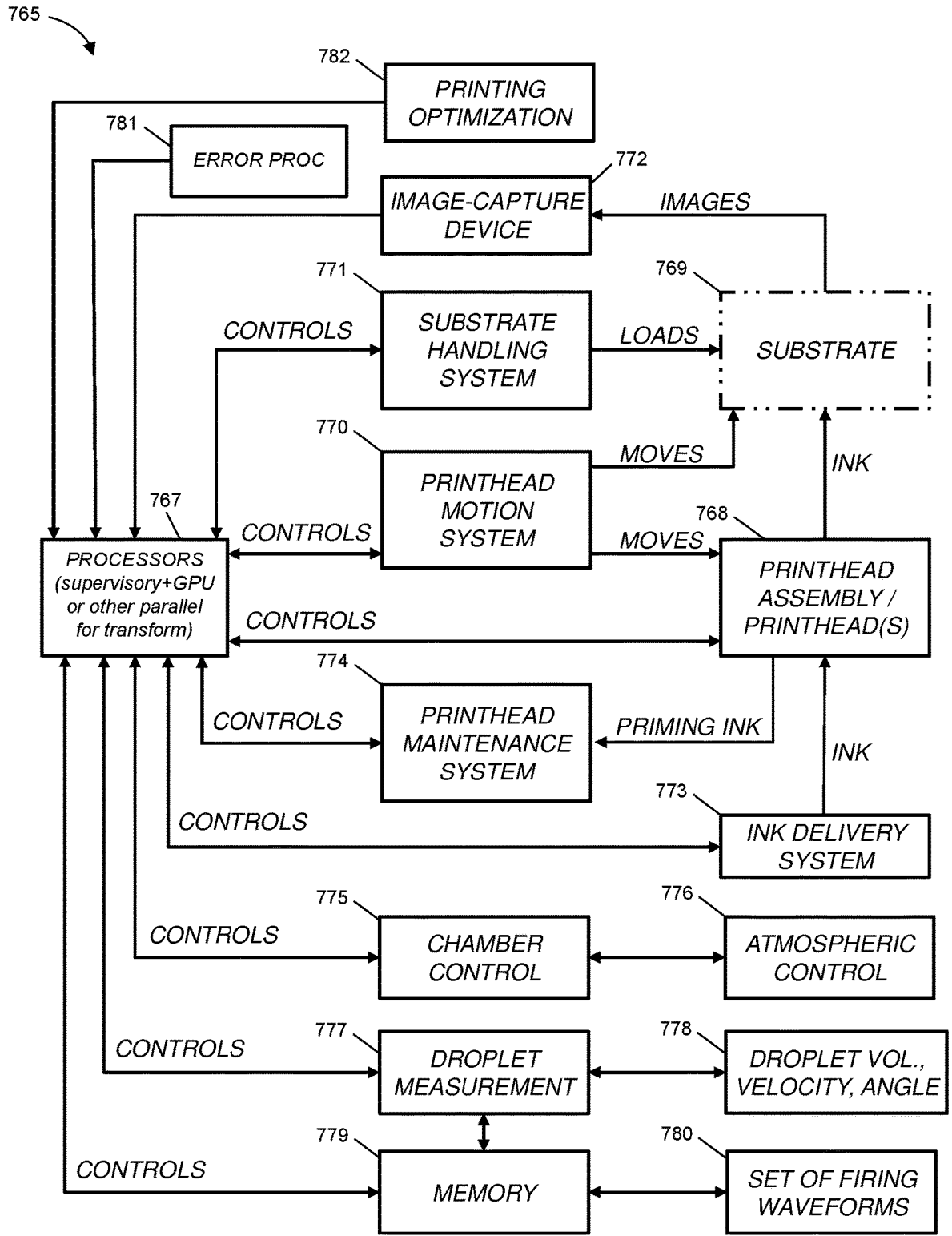
FIG. 7C is a block diagram of an electronic control system for a printer module of FIG. 7A.

FIG. 7C provides additional detail on the structure of the electronic control system (765) for the printer. Coordination over the various subsystems is provided by a set of processors 767, acting under instructions provided by software (not shown in FIG. 7C). In one embodiment, these processors include a supervisory processor or general purpose CPU, and a set of additional processors used for parallel processing. In one specifically-contemplated implementation, these additional processors take the form of a multicore processor or graphics processing unit (GPU, e.g., with hundreds of cores, or more). Each core is assigned a portion of the nozzle firing instructions to process. For example, each core can be assigned a set of nozzles and under control of firmware can test previously-stored nozzle firing instructions, in order to model whether those instructions will satisfy threshold tests for layer homogeneity and minimized wicking, or for other processing purposes, with exception processing applied if they do not. Parallel processing and/or this form of delegation are not required for all embodiments. During a fabrication process, the processors feed data to a print head 768 to cause the print head to eject various volume of ink depending on provided firing instructions. The print head 768 typically has multiple ink jet nozzles, arranged in a row or array, and associated reservoirs that permit jetting of ink responsive to activation of piezoelectric or other transducers; such transducers cause a respective nozzle to eject a controlled amount of ink in an amount governed by an electronic firing waveform signal applied to the corresponding piezoelectric transducer. Other firing mechanisms can also be used. The print head applies the ink to a substrate 769 at various x-y positions corresponding to the grid coordinates. Variation in position is effected both by a print head motion system 770 and substrate handling system 771 (e.g., that cause the printing to describe one or more swaths across the substrate). In one embodiment, the print head motion system 771 moves the print head back-and-forth along a traveler, while the substrate handling system provides stable substrate support and both "x" and "y" dimension transport (and rotation) of the substrate, e.g., for alignment and deskew; during printing, the substrate handling system provides relatively fast transport in one dimension (e.g., the "y" dimension relative to FIG. 7C), while the print head motion system 770 provides relatively slow transport in another dimension (e.g., the "x" dimension relative to FIG. 7C), e.g., for print head offset. In another embodiment, multiple print heads can be used, with primary transport being handled by the substrate handling system 771. An image capture device 772 can be used to locate any fiducials and assist with alignment and/or error detection functions applied to the position and orientation of the substrate.

The apparatus also comprises an ink delivery system 773 and a print head maintenance system 774 to assist with the printing operation. The print head can be periodically calibrated or subjected to a maintenance process; to this end, during a maintenance sequence, the print head maintenance system 774 is used to perform appropriate priming, purge of ink or gas, testing and calibration, and other operations, as appropriate to the particular process. Such a process can also include individual measurement of parameters such as droplet volume, velocity and trajectory, for example, as referenced by numerals 777 and 778.

As was introduced previously, the printing process can be performed in a controlled environment, that is, in a manner that presents a reduced risk of contaminants that might degrade effectiveness of a deposited layer. To this effect, the apparatus includes a chamber control subsystem 775 that controls atmosphere within the chamber, as denoted by function block 776. Optional process variations, as mentioned, can include performing jetting of deposition material in presence of an ambient nitrogen gas atmosphere (or another inert environment, having a specifically selected gas and/or controlled to exclude unwanted particulate). As denoted by numeral 779, the apparatus also includes a memory subsystem that can be used to store halftone pattern information or halftone pattern generation software, template print image data, and other data as necessary. For example, the memory subsystem can be used as operating memory for the transformation of a previously generated print image according to the techniques introduced above, to internally generate printer control instructions that govern the firing of (and timing of) each droplet. If part or all of such rendering is performed elsewhere, and the task of the apparatus is to fabricate a device layer according to a received printer instructions, then the received instructions can be stored in the memory subsystem 779 for use during the printing process and/or manipulation as appropriate. As noted by numeral 780, in one optional embodiment, individual droplet particulars can be varied (e.g., to correct for nozzle aberration) through the variation of firing waveform for any given nozzle. In one embodiment, a set of alternate firing waveforms can be selected in advance and made available to each nozzle, on a shared or dedicated basis, optionally used in conjunction with substrate error processing system 781 (e.g., as further described in US Patent Publication No. 20150298153). While some embodiments use predetermined scan paths (i.e., notwithstanding error), with compensation for error effectuated using different nozzles and/or drive waveforms for certain nozzles, in another embodiment, print optimization (782) is performed to reassess scan path particulars and potentially improve on deposition time.

FIG. 7D provides an illustrative view of a system 785 predicated on optics measurement used in situ to measure droplet parameters for a relatively large print head assembly 786 (i.e., represented by nozzle plates of respective print heads 787A/787B, each with a multitude of individual nozzles, e.g., 788); in a typical implementation, hundreds-to-thousands of nozzles are present. An ink supply (not shown) is coupled to each nozzle (e.g., at nozzle 788), and a piezoelectric transducer (also not shown) is used to jet droplets of ink under the control of a per-nozzle electric control signal. The nozzle design maintains slightly negative pressure of ink at each nozzle (e.g., nozzle 788) to avoid flooding of the nozzle plate, with the electric signal for a given nozzle being used to activate the corresponding piezoelectric transducer, pressurize ink for the given nozzle, and thereby expel one or more droplets from the given nozzle. In one embodiment, the control signal for each nozzle is normally at zero volts, with a positive pulse or signal level at a given voltage used for a specific nozzle to eject droplets (one per pulse) for that nozzle; in another embodiment, different, tailored pulses (or other, more complex waveforms) can be used nozzle-to-nozzle. In connection with the example provided by FIG. 7D, however, it should be assumed that it is desired to measure a droplet volume produced by a specific nozzle (e.g., nozzle 788) where a droplet is ejected downward from the print head (i.e., in the direction "h," representing z-axis height relative to a three-dimensional coordinate system 789) to be collected by a spittoon 790. Note that in a typical application, the dimension of "h" is typically on the order of one millimeter or less and that there are thousands of nozzles (e.g., 10,000 nozzles) that are to have respective droplets individually measured in this manner within an operating printer. Thus, in order to optically measure each droplet with precision (i.e., droplets originating from a specific one of thousands of nozzles in a large print head assembly environment, within the approximately millimeter measurement window, as just described), certain techniques are used in disclosed embodiments to precisely position optical measurement components, the print head assembly 786, or both relative to one another for optical measurement.

In one embodiment, these techniques utilize a combination of (a) x-y motion control (791A) of at least part of the measurement system (e.g., within dimensional plane 792) to precisely position a measurement area 793 immediately adjacent to any nozzle that is to produce a droplet for optical calibration/measurement and (b) below plane optical recovery (791B) (e.g., thereby permitting easy placement of the measurement area next to any nozzle notwithstanding a large print head surface area). Thus, in an exemplary environment having about 10,000 or more print nozzles, this motion system is capable of positioning at least part of the optical system in (e.g.) 10,000 or so discrete positions proximate to the discharge path of each respective nozzle of the print head assembly; in one embodiment, a continuous motion system or a system having even finer positioning capabilities can be used. Contemplated optical measurement techniques include shadowgraphy, interferometry and use of a clear tape to optically measure droplets from many respective nozzles at once (see, i.e., US Patent Publication No. 20150373305 for "Fast Measurement of Droplet Parameters in Industrial Printing System," U.S. Ser. No. 14/840,343, filed on Aug. 31, 2015, which is incorporated by reference). With the first two of these techniques, optics are typically adjusted in position so that precise focus is maintained on the measurement area so as to capture droplets in-flight (e.g., to effectively image the droplet's shadow in the case of shadowgraphy) or once droplets have landed on a tape or measurement surface (e.g., per U.S. Ser. No. 14/840,343). Note that a typical droplet may be on the order of microns in diameter, so the optical placement is typically fairly precise, and presents challenges in terms of relative positioning of the print head assembly and measurement optics/measurement area. In some embodiments, to assist with this positioning, optics (mirrors, prisms, and so forth) are used to orient a light capture path for sensing below the dimensional plane 792, such that measurement optics can be placed close to the measurement area without interfering with relative positioning of the optics system and the print head. This permits effective positional control in a manner that is not restricted by the millimeter-order deposition height h within which a droplet is imaged or the large scale x and y width occupied by a print head under scrutiny. With interferometry-based droplet measurement techniques, separate light beams incident from different angles on a small droplet creates interference patterns detectable from a perspective generally orthogonal to the light paths; thus, optics in such a system capture light from an angle of approximately ninety-degrees off of paths of the source beams, but also in a manner that utilizes below plane optical recovery so as to measure droplet parameters. Other optical measurement techniques can also be used, as stated. In yet another variant of these systems, the motion system 791A is optionally and advantageously made to be a xyz-motion system, which permits selective engagement and disengagement of the droplet measurement system without moving the print head assembly during droplet measurement. Briefly introduced, it is contemplated in an industrial fabrication device having one or more large print head assemblies that, to maximize manufacturing uptime, each print head assembly will be "parked" in a service station from time to time to perform one or more maintenance functions; given the sheer size of the print head and number of nozzles, it can be desired to perform multiple maintenance functions at once on different parts of the print head. To this effect, in such an embodiment, it can be advantageous to move measurement/calibration devices around the print head, rather than vice-versa. [This then permits engagement of other non-optical maintenance processes as well, e.g., relating to another nozzle if desired.] To facilitate these actions, the print head assembly can be optionally "parked," with the system identifying a specific nozzle or range of nozzles that are to be the subject of optical calibration. Once the print head assembly or a given print head is stationary, the motion system 791A is engaged to move at least part of the optics system relative to the "parked" print head assembly, to precisely position the measurement area 793 at a position suitable for detecting a droplet jetted from a specific nozzle; the use of a z-axis of movement permits selective engagement of light recovery optics from well below the plane of the print head, facilitating other maintenance operations in lieu of or in addition to optical calibration. Perhaps otherwise stated, the use of a xyz-motion system permits selective engagement of a droplet measurement system independent of other tests or test devices used in a service station environment. Note that this structure is not required for all embodiments; other alternatives are also possible, such in which only the print head assembly moves and the measurement assembly is stationary or in which no parking of the print head assembly is necessary.

Generally speaking, the optics used for droplet measurement will include a light source 794, an optional set of light delivery optics 795 (which direct light from the light source 794 to the measurement area 793 as necessary), one or more light sensors 796, and a set of recovery optics 797 that direct light used to measure the droplet(s) from the measurement area 793 to the one or more light sensors 796. The motion system 791A optionally moves any one or more of these elements together with spittoon 790 in a manner that permits the direction of post-droplet measurement light from the measurement area 793 around spittoon 790 to a below-plane location, while also providing a receptacle (e.g., spittoon 790) to collect jetted ink. In one embodiment, the light delivery optics 795 and/or the light recovery optics 797 use mirrors that direct light to/from measurement area 793 along a vertical dimension parallel to droplet travel, with the motion system moving each of elements 794, 795, 796, 796 and spittoon 790 as an integral unit during droplet measurement; this setup presents an advantage that focus need not be recalibrated relative to measurement area 793. As noted by numeral 791C, the light delivery optics are also used to optionally supply source light from a location below the dimensional plane 792 of the measurement area, e.g., with both light source 794 and light sensor(s) 796 directing light on either side of spittoon 790 for purposes of measurement, as generally illustrated. As noted by numerals 798 and 799, the optics system can optionally include lenses for purposes of focus, as well as photodetectors (e.g., for non-imaging techniques that do not rely on processing of a many-pixeled "picture"). Note once again that the optional use of z-motion control over the optics assembly and spittoon permits optional engagement and disengagement of the optics system, and precise positioning of measurement area 793 proximate to any nozzle, at any point in time while the print head assembly is "parked." Such parking of the print head assembly 786 and xyz-motion of the measurement system is not required for all embodiments. For example, in one embodiment, laser interferometry is used to measure droplet characteristics, with either the print head assembly (and/or the optics system) is moved within or parallel to the deposition plane (e.g., within or parallel to plane 792) to image droplets from various nozzles; other combinations and permutations are also possible.

FIGS. 8A-8D are used to illustrate issues for fabrication of one or more flat panels on a substrate. Examples are presented in these various FIGS. which illustrate the scanning motion of a print head, relative to a substrate, techniques for encapsulating various electronic components (e.g. of an electronic display), fabrication of layers within the confines of pixel wells or banks, and techniques for layer edge profile management (e.g., when such banks are not present).

Figure 8A:
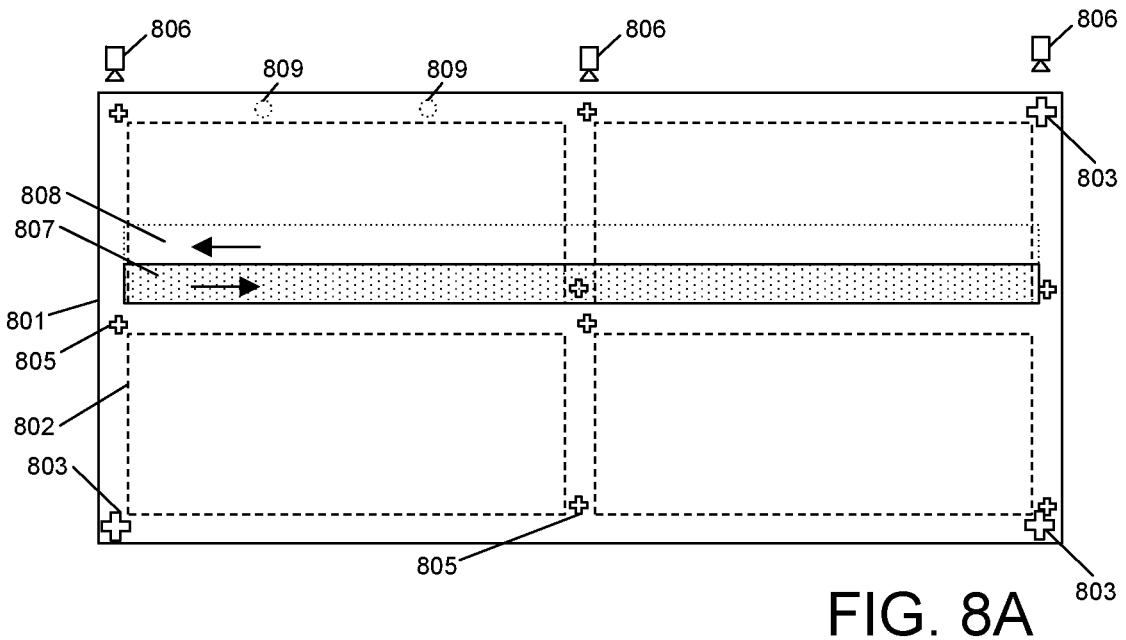
FIG. 8A is a plan view showing printing onto a substrate (801) via multiple scans (e.g., 807 and 808); multiple large panel devices are represented (e.g., 802).

FIG. 8A depicts a substrate 801, with a number of dashed-line boxes representing individual panel products. One such product, seen in the bottom left of the FIG., is designated using reference numeral 802. Each substrate (in a series of substrates) in one embodiment has a number of alignment marks, such as represented by numeral 803. In one embodiment, two such marks 803 are used for the substrate as a whole, enabling adjustment for substrate positional offset, rotation error, and scale error, and in another embodiment, three or more such marks 803 are used to facilitate adjustment for skew and additional types of error. In yet another embodiment, each panel (such as any of the four depicted panels) is accompanied by per-panel alignment marks, such as marks 805. These alignment marks can be used to perform independent error processing per panel or per product; once again, a sufficient number or density of such marks (e.g., three or more per panel or other product) enables compensation for non-linear errors. These marks can be in addition to or in lieu of substrate fiducials 803. In yet another embodiment, alignment marks are reproduced at regular intervals without regard to panel position (e.g., such as represented by ovals 809). Whichever scheme is used, one or more cameras 806 are used to image the alignment marks in order to detect the errors just referenced. In one contemplated embodiment, a single motionless camera is used, and the transport mechanism of the printer (e.g., a handler and/or air flotation mechanism) moves the substrate to position each alignment mark in sequence in the field of view of the single camera; in a different embodiment, the camera is mounted on a motion system for transport relative to the substrate. In yet another embodiment, as discussed below, low and high magnification images are taken, the low magnification image to coarsely position a fiducial for high resolution magnification, with the magnified image being used to identify precise fiducial position according to a printer coordinate system. Reflecting on the earlier discussion, in one embodiment, the transport mechanism of the printer controls motion to within about a micron of intended position.

In a typical implementation, printing will be performed to deposit a given material layer on the entire substrate at once (i.e., with a single print process providing a layer for multiple products). To illustrate this, FIG. 8A shows two illustrative scans 807 and 808 of a print head along the long axis of the substrate; in a split axis printer, the substrate is typically moved back and forth (e.g., in the direction of the depicted arrows) with the printer advancing the print head positionally (i.e., in the vertical direction relative to the drawing page) in between scans. Note that while the scan paths are depicted as linear, this is not required in any embodiment. Also, while the scan paths (e.g., 807 and 808) are illustrated as adjacent and mutually-exclusive in terms of covered area, this also is not required in any embodiment (e.g., the print head(s) can be moved on a fractional basis relative to a print swath, as necessary). Finally, also note that any given scan path typically passes over the entire printable length of the substrate to print a layer for multiple products in a single pass. Each pass uses nozzle firing decisions according to the print grid firing map (as distorted or corrected), and each firing decision can apply a selected, programmed waveform to produce a desired droplet volume, trajectory and velocity. Advantageously, processors on board the printer (as introduced previously) perform both nozzle/droplet measurement and qualification and update of parameters, detection of per-substrate or per-panel particulars, correction of a template print plan, and programming of nozzle firing data. Once printing is finished, the substrate and wet ink (i.e., deposited liquid) can be allowed to rest (e.g., to facilitate melding and settling) and then be transported for curing or other processing of the deposited liquid into a permanent layer. For example, returning briefly to the discussion of FIG. 7A, a substrate can have "ink" applied in a printing module 705, and can then be subsequently transported to a curing chamber 721, all without breaking the controlled atmosphere (i.e., a nitrogen or other inert atmosphere, which is advantageously used to inhibit moisture, oxygen, ozone or particulate contamination).

Figure 8B:
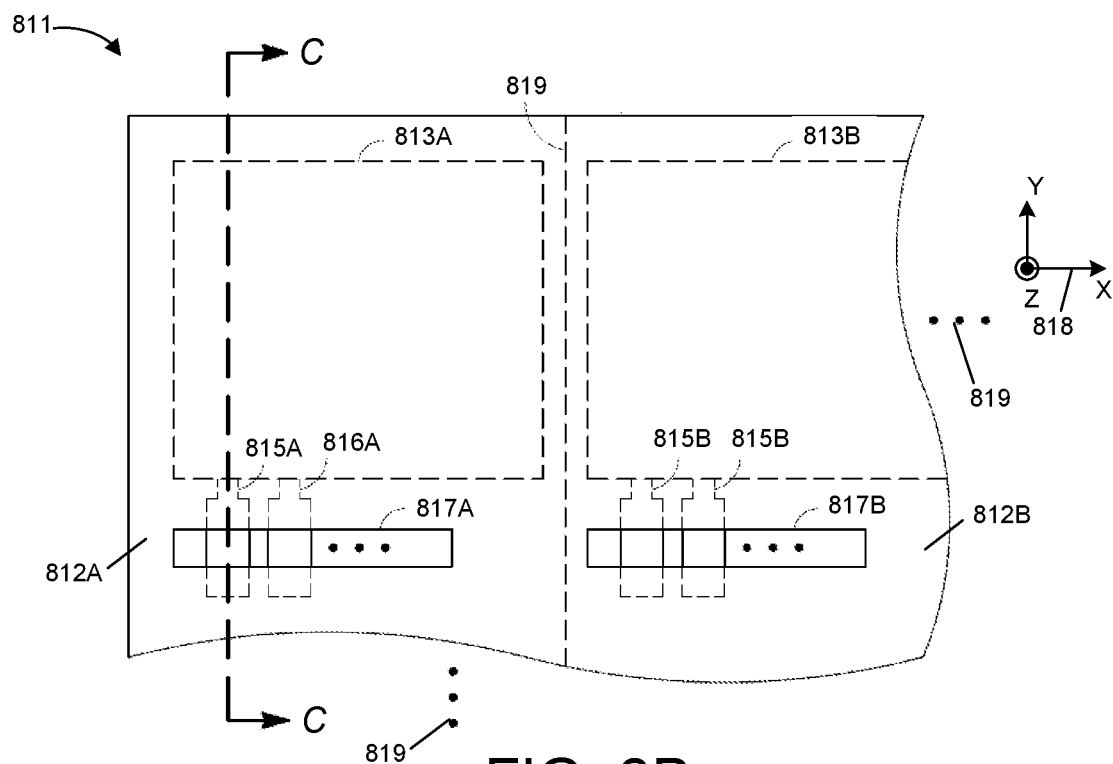
FIG. 8B is a close-up view of a substrate.

FIG. 8B is used to help illustrate one aspect of a process for fabricating of OLED panels in such an environment. Specifically, FIG. 8B shows the substrate in a later stage of the fabrication process, after structures have been added to the substrate, and where an organic encapsulation layer is to be formed over these elements. The assembly is generally represented by numeral 811, and is also seen to feature an array of panels on a common substrate. Features specific to one panel will be designated using a numeral followed by a respective letter, for example, the letter "A" for a first panel, "B" for a second panel, and so forth. Each panel 812A/B has a number of regions that serve different purposes; for example, numerals 813A/813B refer to an active display area that contains light emitting layers (e.g., many pixels). Generally speaking, each active region 813A/B will include electrodes and luminescent layers necessary to provide pixilation and associated routing of electrical signals, such as for control and power. For an active matrix OLED panel design, the active region also contains the electrical circuit components (e.g. capacitors, transistors, electrically conducting lines) that direct current flow to the selected light emitting luminescent pixels. The circuitry in the active region of the respective panel is powered and controlled through electrical contact with the respective terminals (e.g., 815A/B, 816A/B) associated with a terminal block 817A/817B of the respective panel. Typically, the encapsulation layer will provide a protective "blanket" over the active region only (i.e., to seal electroluminescent materials) while permitting unimpeded external access to the terminal block 817A/B. Thus, an encapsulation printing process must deposit liquid ink in a manner that reliably and uniformly covers the active region (813A/813B) without gaps, holes or other defects, while at the same time reliably and uniformly not covering the terminal block 817A/817B. The active region will receive deposited ink to form the desired layer, while the terminal block forms part of an "exposed region" that will not receive the ink. Note in FIG. 8B the use of numeral 818 to denote an xyz coordinate system and the use of numeral 819 to reference respective sets of ellipses to indicate presence of any number of panels replicated in x and y dimensions of the array.

Figure 8C:
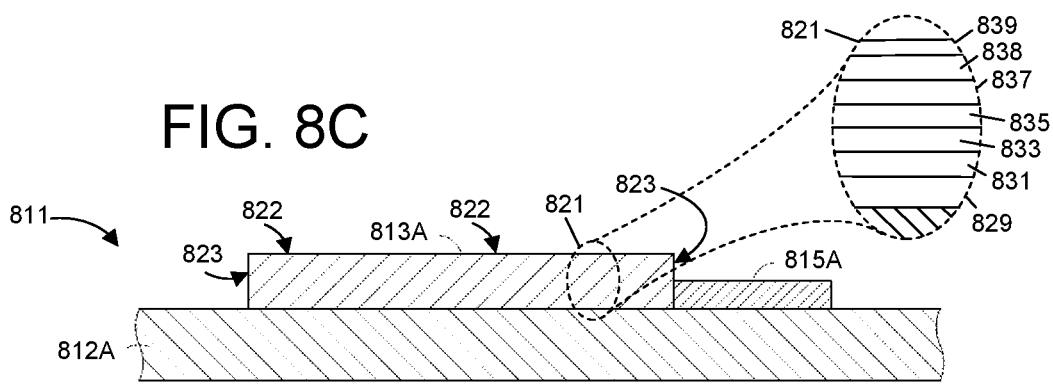
FIG. 8C is a cross-sectional view of the substrate of FIG. 8B, taken along arrows C-C from FIG. 8B.

FIG. 8C is used to illustrate surface topography of underlying electronic components that will receive encapsulation, for example, the light emitting or other active layers of an OLED display pixel. FIG. 8C depicts a cross-section of the assembly 811, taken along lines C-C from FIG. 8B. In particular, this view shows an area of the substrate associated with panel A, the active region 813A of panel A, and conductive terminals (815A) of panel A used to effect electronic connection to the active region. A small elliptical region 821 of the view is seen magnified at the right side of the FIG. to illustrate layers for one pixel well in the active region above the substrate 812A. These layers respectively include an anode layer 829, a hole injection layer ("HIL") 831, a hole transport layer ("HTL") 833, an emissive or light emitting layer ("EML") 835, an electron transport layer ("ETL") 837, an electron injecting layer ("EIL") 838, and a cathode layer 839. Additional layers, such as hole blocking layers, electron blocking layers, polarizers, barrier layers, primers and other materials can also be included. Once finished, the OLED device will operate generally as follows; application of a forward bias voltage (anode positive with respect to the cathode) will result in hole injection from the anode 829 and electron injection from the cathode layer 839. Recombination of these electrons and holes results in the formation of an excited state of the emitting layer 835 material which subsequently relaxes to the ground state with emission of a photon of light. In the case of a "bottom emitting" structure, light exits through a transparent anode layer 829 formed beneath the hole injection layer 831. A common anode material can be formed, for example, from indium tin oxide (ITO). In a bottom emitting structure the cathode layer 839 is reflective and opaque. Common bottom emitting cathode materials include Al and Ag with thickness typically greater than 100 nm. In a top emitting structure, emitted light exits the device through the cathode layer and for optimum performance the anode layer is highly reflective and the cathode is highly transparent. Commonly used reflective anode structures include a layered structure with a transparent conducting layer (e.g. ITO) formed over a highly reflective metal (e.g. Ag or Al) and providing efficient hole injection. Commonly used transparent top emitting cathode layer materials providing good electron injection include Mg:Ag (~10-15 nm, with atomic ratio of ~10:1), ITO and Ag (10-15 nm). The HIL 831 is typically a transparent, high work function material that readily accepts holes from the anode layer 829 and injects holes into the HTL 833 layer. The HTL 833 is another transparent layer that passes holes received from the HIL 831 layer to the EML layer. Electrons are provided to the electron injection layer (EIL 838) from the cathode layer 839. Electron injection into the electron transporting layer is followed by injection from the electron transporting layer to the EML where recombination with a hole occurs with subsequent emission of light. The emission color is dependent upon the EML layer material and for a full color display is typically red, green or blue. The emission intensity is controlled by the rate of electron-hole recombination, which is dependent upon the drive voltage applied to the device.

Figure 8D:
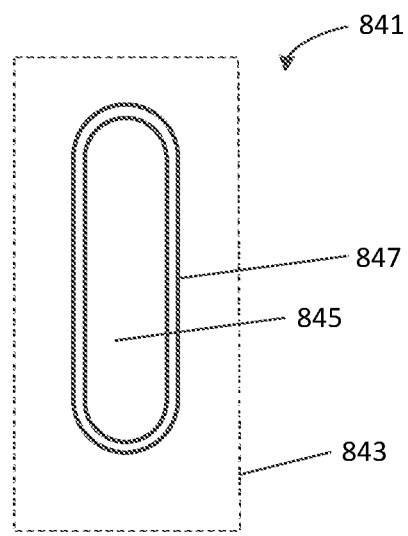
FIG. 8D is a plan view of a pixel well.

As noted, layers in the active region can be degraded through exposure to oxygen and/or moisture. It is therefore desired to enhance OLED life by encapsulating these layers, both on faces (822) or sides (823) of those layers. The purpose of encapsulation is to provide an oxygen and/or moisture resistant barrier, as mentioned. The techniques disclosed herein, in addition to being used to deposit organic light emissive layers, can also be used for the fabrication of encapsulation layers. FIG. 8D, discussed just below, discusses layer fabrication within the confines of a pixel bank or "well," while FIG. 9A will be used to discuss encapsulation layer fabrication.

FIG. 8D shows an example of a pixel well, generally denote by numeral 841. A dashed-line box 843 indicates that this pixel well is but one example of many such wells defined on a substrate (e.g., many millions in the case of an HDTV screen, with separate pixel wells for each of red, green and blue picture elements in this example). Numeral 847 identifies a structural ridge which serves to "dam" printed liquid within a central region 845—that is, to form light generating elements of a pixel, a conductor can be first deposited throughout region 843 (or in a manner that provides electrical contact to a point within region 845, with the ridge then built over this structure), and light generating elements such as various ones of the layers identified above in connection with FIG. 8C are then deposited as liquids within the well and processed to form a permanent layer. Within such a well, it is desired to have good layer homogeneity, and the techniques presented above are advantageously used to further this end.

Note all layers are deposited within a confining structure, e.g., an encapsulation layer can be deposited in some applications to span many electronic components, such as pixels of a display device; in some designs, a confining bank structure (or photolithographic structure) can optionally be used, much as was the case for the pixels discussed above, but this need not be the case for all designs. In many electronic display designs, for example, it is possible to deposit layers so as to form a natural border or transition as part of the deposition process.

As noted earlier, it is frequency desired to provide a crisp, straight edge at border regions. Returning briefly to FIG. 5B for example (i.e., see numeral 565), if ink density is maintained on a consistent basis up to exactly layer periphery, the surface tension of the ink can cause the liquid ink to form "horns" or "bat ears." FIGS. 9A-9G are used to discuss techniques for varying ink density at border regions in order to mitigate this effect and related effects, e.g., by adjusting "scaling" of the volume/area at portions of a layer which are adjacent to the edge of a layer. This scaling can be performed to customize thickness in these regions to increase or decrease edge height, as pertinent to the design. In one embodiment, this technique involves reducing the scaling of droplet density near an edge or corner of an intended print area. In another embodiment, droplet sizes can be varied (e.g., scaled), or locally deposited ink volumes otherwise controlled/customized to achieve these benefits.

Figure 9A:
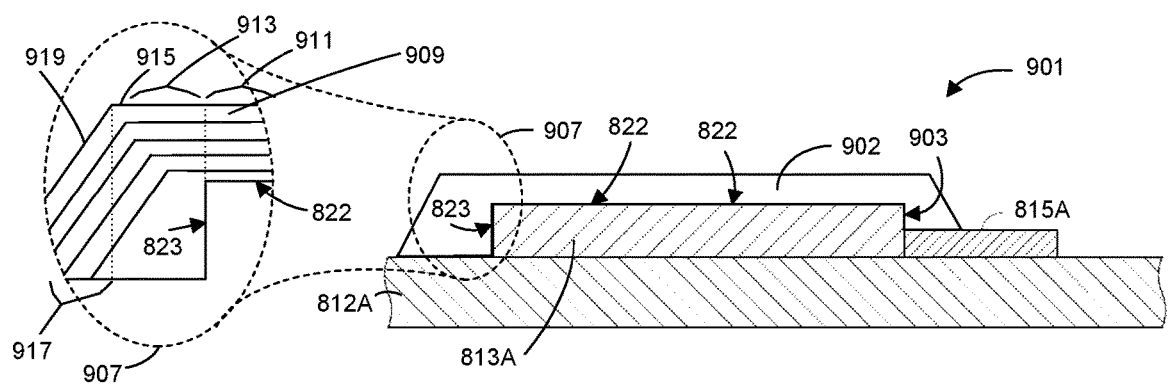
FIG. 9A is a view similar to FIG. 8C, but with an encapsulation layer 902 added thereto.

FIG. 9A shows an aggregate structure 901 where encapsulation 902 has been added to the substrate and where a border or taper is to be used (e.g., in lieu of deposition within a confining structure). Note that the encapsulation 902 now encloses faces 822 and lateral edges 823 relative to the substrate 812A (from FIG. 8C) and that the encapsulation extends laterally to occupy a deposition area larger than the underlying active layers; at a terminus of this area, the encapsulation forms a taper or border region to help enclose/seal lateral edges and leave terminals 815A exposed; the border region in this case provides a transition between a target region for the layer of interest (e.g., area where electronic components are to be encapsulated) and an area where the layer of interest is not to be formed (e.g., area where terminals are exposed, or product or substrate edge). This is depicted at the left side of FIG. 9A within a magnified elliptical region 907. As seen in this expanded view, the encapsulation comprises a number of thin layers, for example, alternating organic and inorganic layers, which provide a barrier against moisture and oxygen. The organic encapsulation layers can be advantageously deposited using the techniques introduced above, with the thickness of each individual layer regulated using the mentioned techniques. Relative to a particular organic encapsulation layer 909, a first region 911 overlies underlying structures, such as the mentioned electrodes and the other OLED layers discussed above. A second region 913 operates as a buffer region, i.e., to maintain a substantially uniform surface 915 that is planar with the first region 911. Optionally, deposited thickness can be the same in both of regions 911 and 913, but this need not be the case for all deposition processes. Irrespective of region, an ink jet printing process using techniques described herein can be used to control thickness and promote uniformity of the particular encapsulation layer 909, at least where structures are to be encapsulated and also, optionally, in the second, buffer region 913. Finally, a third, gradient or border region 917 represents a transition to an exposed area of the underlying substrate (e.g., to provide electrical terminals for the active region). Numeral 919 indicates an associated taper in the encapsulation surface as it transitions to exposed substrate.

Figure 9B:
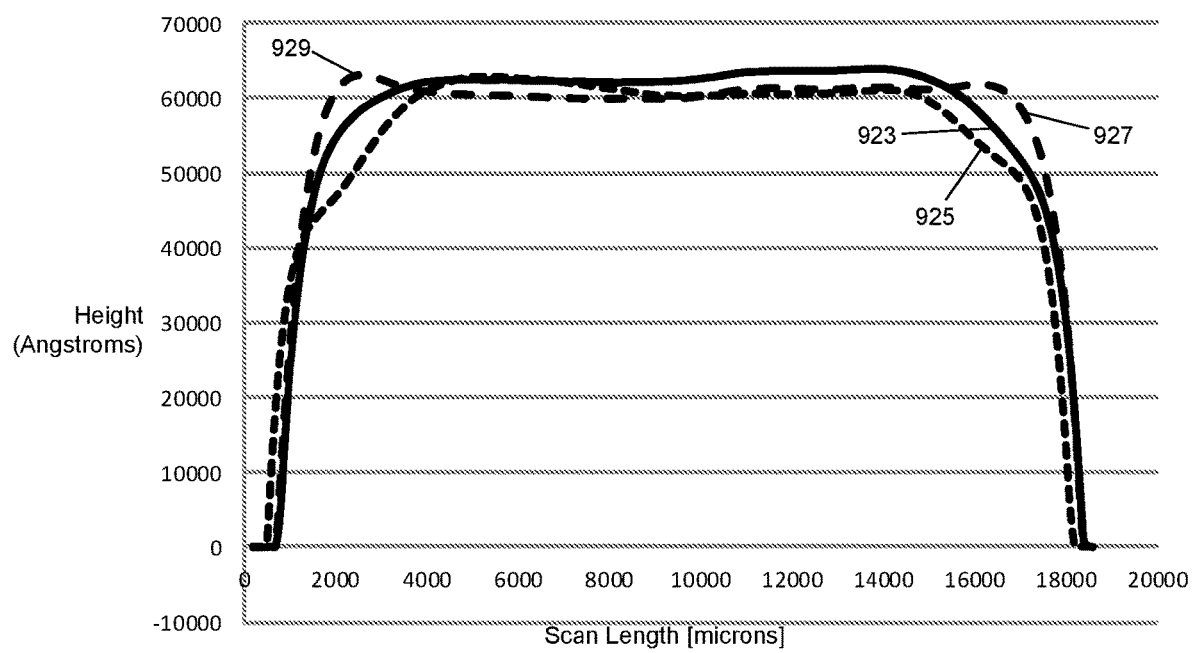
FIG. 9B is a plot of layer thickness for different layers created using certain edge processing techniques discussed herein.

FIG. 9B represents a graph 921 that illustrates how the techniques described herein can be applied to shape layer edges; such a technique is particularly useful where no confining structure is used, although of course, it is also optional to use such a technique within a confining structure. More specifically, three curves 923, 925 and 927 are presented in FIG. 9B, obtained using stylus profilometer measurements of fabricated 6.0 micron encapsulation layers. The differences between these curves were produced by densities applied to unit areas of substrate ("print cells") in areas that abut lateral edges of the intended layer. Relative to a baseline represented by curve 923, curve 925 represents a process where the ink volume/density for the print cell is decreased on approach to a boundary in the encapsulation layer (e.g., before the encapsulation layer periphery). By contrast, curve 927 represents a process where the ink volume/density is increased for print cells abutting the same boundary; note that the resultant layer thickness actually increases slightly immediately before the boundary, e.g., at x positions of 2000μ and 17000μ. By adjusting the ink volumes/densities or other particulars for border regions, a designer can adjust edge buildup at layer boundaries in a desired manner, including for purposes of providing a uniform layer thickness or surface, or smoothing or enhancing transitions. Note that the amount of the ink buildup adjacent to the layer edges will be largely dependent on ink properties, such as surface tension (and its dependence on temperature), and so many of the adjustment principles described herein can be used to tailor this buildup. For example, some inks may naturally form a lip, or so-called capillary ridge, (e.g., such as represented at point 929 of curve 927); in such an event, the volume/droplet density adjustment process described herein can be applied so as to remove this lip, e.g., to help tailor thickness of the ultimate layer by decreasing scaling values or otherwise adding an adjustment or correction factor for print cells abutting a layer edge, such that the profile of the permanent layer more closely matches curve 923. Other processes can also be used to same effect, for example, using "larger" or "smaller" droplet sizes in the border region, or multiple droplet sizes that are "skewed" on approach to a border, or pattern modification techniques (e.g., where droplets are selectively removed from a pattern in order to tailor edge profile). Many other techniques will occur to those having skill in the art.

Spreading characteristics of ink can potentially affect layer edge and corner sharpness on a profound basis, e.g., as dot gain increases (i.e., an ink spreads excessively), it becomes more difficult to control such sharpness. Thus, as just introduced, ink volume, droplet density, and/or droplet size or density can be varied at or adjacent edges or corners.

Figure 9C:
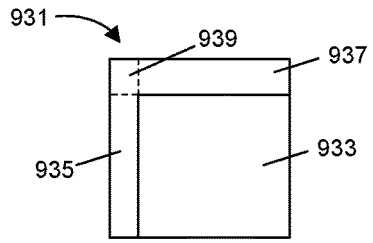
FIG. 9C is a plan view of a corner of a flat panel electronic device, with edge processing techniques applied thereto.

FIG. 9C provides a depiction 931 used to illustrate effects at a corner 939 of a deposited layer 933, with grid points not shown. To produce a thin film, ink volume/droplet density can be made relatively sparse in areas 935 and 937 relative to portions of the intended layer (933) which are not near a layer edge, which helps mitigate the "horns" or "bat ears" just discussed (e.g., see FIGS. 5B and 9B). However, dependent on spreading characteristics, if a sparse ink deposition is used in regions 935, 937, and 939, the associated "low" ink volume/density may produce a jagged edge. Thus, ink volume (e.g., droplet size, the density of droplets, etc.) in areas 935, 937 and 939 can also be purposely increased or the deposition particulars otherwise altered to improve edge linearity. Alternatively, effective grid spacing, dedicated scan passes using alternate nozzle drive waveforms (e.g., selected so as to vary droplet volumes) or other techniques described herein can also be applied to the same effect.

Figure 9E:
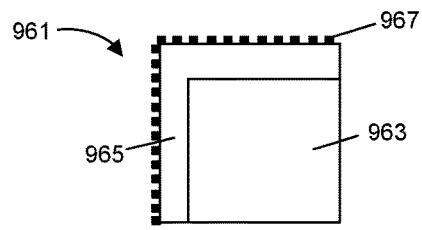
FIG. 9E is another plan view of a corner of a flat panel electronic device, with edge processing techniques applied thereto.
Figure 9D:
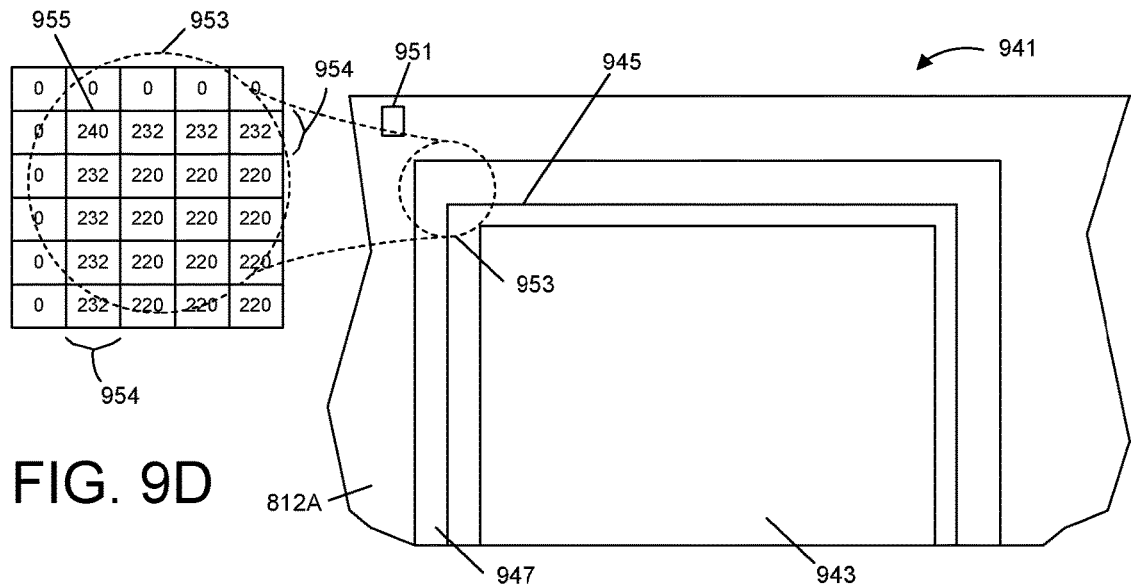
FIG. 9D is another plan view of a corner of a flat panel electronic device, with edge processing techniques applied thereto.

FIG. 9D provides a depiction 941 used to help illustrate one processing technique that adjusts material thickness at layer edges in the context of an OLED panel. For example, in an encapsulation process such as the one discussed, it can be desirable to ensure consistent thickness in the hardened layer all the way to a planned encapsulation periphery in order to provide for reliable edge sealing of any underlying sensitive material layers. The substrate is observed in a plan view, though depiction of the electrical terminals is omitted. Note the use of a fiducial 951 to align processes such that an organic encapsulation layer is correctly printed over underlying substrate. Substrate geography where the encapsulation layer is to be deposited is seen to comprise areas 943 and 945 (e.g., corresponding roughly to the use of numerals 911 and 913 as discussed above in connection with FIG. 9A). Rather than have undesired edge effects given spreading of deposited ink and the effect of surface energy/tension of that ink, the scaling of the ink volume/area or droplet density can be adjusted in this embodiment along the intended layer's edge and, in so doing, alter the edge profile at the substrate/layer periphery. For example, scaling within region 945 can be increased as depicted by grayscale values seen at the left of FIG. 9D so as to optionally increase ink volume in areas approaching the boundary, or a correction factor can be added to planned in volumes. Note in this regard that each unit area of the substrate (each represented by a value of 0-255) can initially be associated with a particular thickness, for example, represented by hypothetical grayscale value, "220" in this example. If it is determined empirically that due to ink spreading, a transition (for example, at the boundary between regions 945 and 947) provides insufficient coverage, the grayscale value can be selectively increased to provide mitigation, for example, by increasing the value (e.g., from "220" to "232" in FIG. 9D) for one or more rows or columns of target regions representing the layer periphery, e.g., corresponding to region 945 and associated scaling values 954. Corrections can be prestored as a correction image or firing map (e.g., as the corrections might, depending on application, vary as a function of process, temperature, ink and other factors), or they can otherwise be incorporated into the original nozzle firing instructions or other stored data. In connection with the techniques described in U.S. Pat. No. 8,995,022, referenced earlier, these grayscale values can be used to select a droplet density (e.g., halftone density); alternatively, these values can be used in a second embodiment to adjust (or select) a waveform to be applied to a group of nozzles. Note that where multiple boundary conditions are present, for example, intersection of two borders, it may be desired to provide further adjustment, such as the depicted grayscale value of "240" for corner target region 955. Clearly many possibilities exist, and the use of grayscale values as exemplified by FIG. 9D is not required for all embodiments. By adjusting volume/area, droplet volume and/or droplet density in these border regions (or otherwise adjusting effective ink volume in dependence on premeasured characteristics), the techniques introduced above permit customized control over the layer edges in any manner suitable to the particular deposition process at issue, for example, to facilitate edge sealing of flat panel devices. Note that it is also possible for software to automatically provide for adjusted droplet size/density scaling any time the software detects print cells within a defined distance from a layer edge. As will be shown below, an optional technique of "fencing" can also be employed, either in addition to or in lieu of such volume/density adjustment, depending on desired embodiment or effect.

Selection of a particular technique to tailor edge buildup (or other transitions in layer thicknesses) can be made by a skilled designer dependent on a number of factors. For example, adjustment of droplet density may make sense if typical layer thickness is predicated (for a particular layer deposition process) on print head scans that involve intermediate densities relative to the print grid, i.e., such that there exists headroom to modify ink volume/area (e.g., without compromising "blanket" substrate coverage in the area of the edge). Conversely, varying print drop sizes (without varying droplet density) can be effective where one has the capability to change droplet size (to a larger or smaller size) also without affecting "blanket" substrate coverage in the area of interest. Employed together, these techniques can be quite powerful for producing an edge profile meeting nearly any desired goal.

FIG. 9E helps illustrate "fencing" to improve edge integrity and shows a portion of a substrate 961 that is to have a central region 963 of uniform layer thickness, a border region 965 of "adjusted" ink volume/area, droplet density or droplet size (i.e., selected so as to avoid edge buildup) and a set of fencing clusters 967 selected to provide edge uniformity. Perhaps otherwise stated, central region 963 represents an area of substantially ink, border region 965 represents an area of adjusted ink volume or density relative to the central region, and fencing clusters 967 represent a relatively dense ink pattern selected to provide sharp, well-defined layer edges in the final layer. It is believed that the mixture of fixed structure within the random and more sparse structure of the tapering edge will lead to less raggedness and reduce the chance of larger voids should ink volume become overextended on approach to an edge. In alternative designs, fencing clusters can be placed immediately adjacent to the central region (e.g., with no border region between clusters and the central region), or can be made part of (i.e., an edge) of the central region itself. As should be appreciated by these examples, many variations are possible which rely on additional density variation in order to tailor edge buildup and/or provide for desired edge characteristics.

Figure 9F:
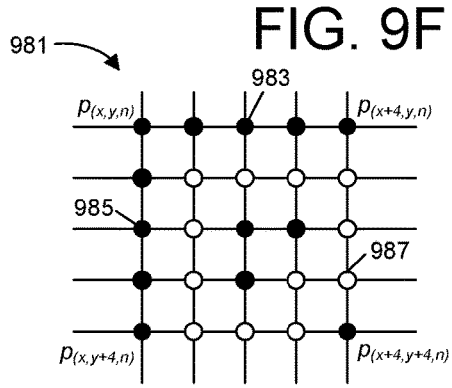
FIG. 9F is a view of a print grid droplet deposition pattern that is specially configured for use at the corner of a layer.
Figure 9G:
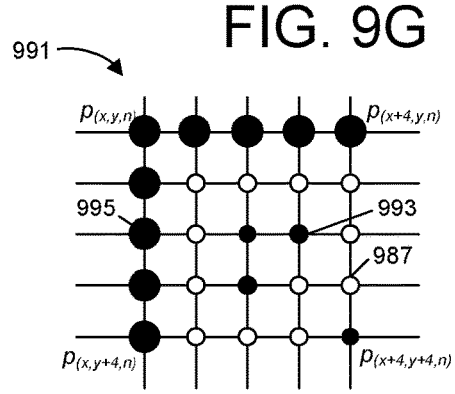
FIG. 9G is a view of another print grid droplet pattern that is specially configured for use at the corner of a layer (e.g., using multiple droplet sizes).

Note that in addition to adjusting gray scale values for border regions, it is also possible to adjust the location or pattern of print droplet firing decisions applied to such a region, i.e., to modify local firing decisions and so provide a "skewed" droplet pattern near edges. For example, FIG. 9F shows an exemplary print grid pattern 981 that could be used where, the region represents the corner of a deposited film; FIG. 9F is similar to FIGS. 3A-3C, 3E and 5B in its reference to a print grid. The particular droplet pattern represented in FIG. 9F represents a similar ink volume to the pattern seen of FIG. 5B (i.e., about 13 of 25 possible droplets ejected). However, the pattern in FIG. 9F features relatively dense use of droplets along a top edge 983 of the substrate and a left edge 985 of the film, while interior region 987 is left relatively sparse, i.e., to produce relatively crisp left and upper edges. Such a technique can be combined further this variations in droplet size and/or grid spacing and/or other deposition particulars referenced earlier in order to customize the edge profile of the finished layer. In a variant, represented by FIG. 9G, variable droplet sizes can also be used for this purpose, e.g., a print grid pattern 991 can feature a large droplet size selection (995) at periphery of the pattern, e.g., to provide fencing or for other effects, while smaller droplet sizes (993) or sparse droplet firings (e.g., 987) can be used at other portions within the pattern.

Note that the use of the various edge customization, framing or "fencing" techniques is not required for all embodiments, and it is within the capabilities of one of ordinary skill in the art to determine the best strategy for a particular application, ink and process technology. Also, while the focus of the examples of FIGS. 9A-G has been an encapsulation layer, these same principles can be applied to the formation of any desired layer. For example, it is expressly contemplated that the described printing principles can be used to fabricate any of the HIL, HTL, EML, ETL or other layers of an OLED device, for example, by way of illustration, with respective pixel wells or on another patterned or unpatterned basis.

Reflecting on the techniques presented above, what has been described are a set of processes for improving homogeneity of a processed, hardened layer originally deposited as discrete droplets representing a layer of ink. Through careful control of print process and parameter adjustment in the manner described, it is possible to plan print particulars in advance in a manner that deposits droplets to provide for a locally uniform ink volume, and even controls melding of adjacent droplets, in a manner that mitigates against wicking and associated layer defects. By automatically adjusting processes based on expected droplet characteristics, including ink spreading, it becomes possible to improve print speed and to otherwise provide for a more homogeneous layer than would otherwise be possible, thereby improving layer quality and product quality, and ultimately lowering product manufacturing cost.

It should be appreciated that this disclosure provides specific examples of system, methods, services and software that greatly enhance electronic device fabrication and electronic flat panel fabrication in particular. These techniques can be extended to systems, commercial products or software, or other forms of implementation.

Other applications will readily occur to those who familiar with printing processes for electronic device fabrication in view of the teachings provided above, or in view of the invention defined by the claims set forth below. Accordingly, the foregoing discussion is intended to be illustrative only; other designs, uses, alternatives, modifications and improvements are also possible which are nonetheless within the scope of the present disclosure, which is limited and defined only by the following claims and equivalents thereto.

We claim:

1. A method of fabricating a layer of an electronic device on a substrate surface, the method comprising:
   receiving a desired thickness of a finished layer to be formed on the substrate surface;
   receiving data representing a spreading characteristic of liquid droplets to be deposited on the substrate surface;
   based on the spreading characteristic, selecting a largest droplet size from a plurality of available droplet sizes that results in a height of the finished layer after processing that is no greater than the desired thickness;
   dependent on the data, calculating a volume of the liquid per unit area of the substrate surface necessary to produce a continuous liquid coat on the substrate surface in a manner not having voids within the unit area of the substrate surface;
   scaling the volume of the liquid per unit area according to the desired thickness;
   determining a number of droplets of the liquid per unit area necessary to produce the scaled volume of the liquid per unit area; and
   assigning nozzle firing decisions to respective nozzles of a print head in the printer, to cause the printer to deposit droplets according to the number of droplets of the liquid per unit area to produce the desired thickness of the layer;
   using the printer to print droplets according to the assigned nozzle firing decisions to form the continuous liquid coat; and
   processing the continuous liquid coat to form the finished layer.

2. The method of claim 1, wherein the desired thickness is greater than the thickness produced by the volume per unit area by a threshold amount.

3. The method of claim 1, wherein:
   using the printer comprises printing the droplets according to the selected droplet size;
   the available droplet sizes are droplet sizes each nozzle can produce dependent on a respective nozzle control signal; and
   determining the number of droplets of the liquid per unit area is based on droplet size.

4. The method of claim 3, wherein:
   each droplet size of the plurality of available droplet sizes is a multiple of a smallest size of the plurality of available droplet sizes; and
   the nozzle control signals convey droplet size as a function of the smallest droplet size.

5. The method of claim 3, wherein:
   assigning comprises calling a software routine to assign the nozzle firing decisions in a manner that identifies the selected droplet size to the software routine; and
   using the printer comprises printing the droplets according the nozzle firing decisions to deposit droplets of the selected size.

6. The method of claim 1, wherein:
   the desired film thickness is less than or equal to 4.0 microns; and
   the selected droplet size corresponds to a volume that is less than or equal to 7.0 picoliters.

7. The method of claim 1, wherein the printer is to print the droplets at nodes of a print grid, a cross-scan spacing between the nodes of the print grid defining a minimum spacing between adjacent droplets in a cross-scan direction, and an in-scan spacing between the nodes of the print grid defining a minimum spacing between adjacent droplets in an in-scan direction, and wherein assigning the nozzle firing decisions comprises varying the cross-scan spacing or the in-scan spacing depending on the desired thickness.

8. The method of claim 7, wherein the printer includes a mechanism for rotating at least one of the substrate or the print head relative to the in-scan direction, and wherein:
   varying the cross-scan spacing or the in-scan spacing includes causing the mechanism to rotate the at least one of the substrate or the print head relative to the in-scan direction, to vary the spacing between the nodes of the print grid in the cross-scan direction; and
   using the printer comprises printing onto the substrate according to the varied spacing.

9. The method of claim 7, wherein the printer comprises circuitry to generate a timing signal to trigger firing of each of the nozzles according to the respective nozzle firing decisions, and wherein varying the cross-scan spacing or the in-scan spacing includes controlling the circuitry to vary frequency of the timing signal, to vary the spacing between the nodes of the print grid in the in-scan direction, given the scanning velocity.

10. The method of claim 1, wherein the method further comprises using the printer to print a test pattern onto a substrate, optically measuring the printed test pattern, and identifying the spreading characteristic dependent on the optical measurement.

11. The method of claim 1, wherein assigning the nozzle firing decisions comprises varying size of at least some of the droplets based on the desired thickness.

12. The method of claim 11, wherein the size of the droplets is varied among at least four predetermined droplet sizes.

13. The method of claim 1, further comprising, if the finished layer cannot be produced to be less than or equal to the desired thickness, performing at least one of (a) selecting a different droplet size for use in printing, or (b) changing at least one spacing of a print grid according to which the droplets are printed.

14. A method of processing a substrate, using a printer having a print head capable of producing discrete droplets having a plurality of droplet sizes, the method comprising:
receiving a desired thickness of a finished layer to be formed on the substrate;
receiving data representing a spreading characteristic of a liquid to be deposited and processed on the substrate to form the finished layer;
based on the spreading characteristic, selecting a largest droplet size from the plurality of droplet sizes that results in a height of the finished layer that is no greater than the desired thickness;
based on the selected droplet size, identifying a droplet density to form a liquid layer having no voids within the unit area;
determining a volume of the liquid layer per unit area;
scaling the volume according to the desired thickness;
scaling the droplet density according to the scaled volume;
assigning nozzle firing decisions to respective nozzles of the print head;
printing a continuous liquid layer according to the assigned nozzle firing decisions using the selected droplet size and scaled droplet density; and
processing the continuous liquid layer to form the finished layer.

15. The method of claim 14, wherein the scaled volume is greater than the volume by at least a threshold amount.

16. The method of claim 14, further comprising, for each of the plurality of droplet sizes, identifying a droplet density to form a liquid layer having no voids within the unit area.

17. The method of claim 1, wherein the plurality of droplet sizes includes a smallest droplet size and printing a continuous liquid layer according to the assigned nozzle firing decisions comprises generating nozzle control signals that convey droplet size as a function of the smallest droplet size.

18. The method of claim 1, wherein assigning nozzle firing decisions comprises calling a software routine to assign the nozzle firing decisions in a manner that identifies the selected droplet size to the software routine.

19. The method of claim 14, wherein the printer is to print the droplets at nodes of a print grid, a cross-scan spacing between the nodes of the print grid defining a minimum spacing between adjacent droplets in a cross-scan direction, and an in-scan spacing between the nodes of the print grid defining a minimum spacing between adjacent droplets in an in-scan direction, and wherein assigning the nozzle firing decisions comprises varying the cross-scan spacing or the in-scan spacing depending on the desired thickness.

20. The method of claim 19, wherein the printer includes a mechanism for rotating at least one of the substrate or the print head relative to the in-scan direction, and wherein:
varying the cross-scan spacing or the in-scan spacing includes causing the mechanism to rotate the at least one of the substrate or the print head relative to the in-scan direction, to vary the spacing between the nodes of the print grid in the cross-scan direction; and
using the printer comprises printing onto the substrate according to the varied spacing.

* * * * *